US012812920B2

(12) United States Patent
Kimpara

(10) Patent No.: US 12,812,920 B2
(45) Date of Patent: Nov. 24, 2026

(54) SEMICONDUCTOR DEVICE AND METHOD OF MANUFACTURING THE SAME

(71) Applicants: DENSO CORPORATION, Kariya-city (JP); TOYOTA JIDOSHA KABUSHIKI KAISHA, Toyota (JP); MIRISE Technologies Corporation, Nisshin (JP)

(72) Inventor: Hiromichi Kimpara, Nisshin (JP)

(73) Assignees: DENSO CORPORATION, Kariya-city (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 429 days.

(21) Appl. No.: 18/361,030

(22) Filed: Jul. 28, 2023

(65) Prior Publication Data

US 2024/0038834 A1 Feb. 1, 2024

(30) Foreign Application Priority Data

Aug. 1, 2022 (JP) ................................ 2022-122706

(51) Int. Cl.

| | |
|---|---|
| ***H10D 62/10*** | (2025.01) |
| ***H10D 30/01*** | (2025.01) |
| ***H10D 30/66*** | (2025.01) |
| ***H10D 62/832*** | (2025.01) |

(52) U.S. Cl.

CPC ....... *H10D 62/102* (2025.01); *H10D 30/0297* (2025.01); *H10D 30/668* (2025.01); *H10D 62/8325* (2025.01)

(58) Field of Classification Search

None

See application file for complete search history.

(56) References Cited

U.S. PATENT DOCUMENTS

| | | | |
|---|---|---|---|
| 2006/0256487 A1 | 11/2006 | Kishimoto et al. |
| 2008/0303114 A1 | 12/2008 | Shibata et al. |
| 2010/0244123 A1 | 9/2010 | Grimaldi et al. |
| 2019/0088738 A1 | 3/2019 | Ono et al. |
| 2020/0119142 A1 | 4/2020 | Ono et al. |

(Continued)

FOREIGN PATENT DOCUMENTS

| | | |
|---|---|---|
| JP | 2007-013003 A | 1/2007 |
| JP | 2008-305827 A | 12/2008 |

(Continued)

*Primary Examiner* — Jack S Chen

(74) *Attorney, Agent, or Firm* — Posz Law Group, PLC

(57) ABSTRACT

A method of manufacturing a semiconductor device includes: forming a lower layer of a repeating layer in which a first conductivity column and a second conductivity column are alternately arranged in a repeating direction by replacing a lower epitaxial layer for the first conductivity column with a region for the second conductivity column; and forming an upper layer of the repeating layer by replacing an upper epitaxial layer for the first conductivity column with a region for the second conductivity column. The second conductivity column includes a central portion and an end portion between the central portion and a boundary surface of the lower layer and the upper layer. A width of the end portion in the repeating direction is smaller than that of the central portion.

7 Claims, 44 Drawing Sheets

(56) References Cited

U.S. PATENT DOCUMENTS

| | | | |
|---|---|---|---|
| 2020/0235203 A1 | 7/2020 | Furuhashi et al. | |
| 2020/0295129 A1 | 9/2020 | Kinoshita | |
| 2021/0074808 A1 | 3/2021 | Nishimura | |
| 2021/0183995 A1* | 6/2021 | Kobayashi | H10D 62/157 |

FOREIGN PATENT DOCUMENTS

| | | |
|---|---|---|
| JP | 2010-056154 A | 3/2010 |
| JP | 2010-147182 A | 7/2010 |
| JP | 2013-089723 A | 5/2013 |

* cited by examiner

SEMICONDUCTOR DEVICE AND METHOD OF MANUFACTURING THE SAME

CROSS REFERENCE TO RELATED APPLICATION

This application is based on Japanese Patent Application No. 2022-122706 filed on Aug. 1, 2022, the disclosure of which is incorporated herein by reference.

TECHNICAL FIELD

The present disclosure relates to a semiconductor device and a method of manufacturing the semiconductor device.

BACKGROUND

A semiconductor device includes a repeating layer in which n-type columns and p-type columns are alternately arranged in a semiconductor substrate.

SUMMARY

According to an aspect of the present disclosure, a method of manufacturing a semiconductor device having a repeating layer in which a first conductivity column and a second conductivity column are alternately arranged in a repeating direction includes: forming a lower layer of the repeating layer in which a lower portion of the first conductivity column and a lower portion of the second conductivity column are alternately arranged in the repeating direction by replacing a lower epitaxial layer for the first conductivity column with a region for the second conductivity column; and forming an upper layer of the repeating layer on the lower layer, in which an upper portion of the first conductivity column and an upper portion of the second conductivity column are alternately arranged in the repeating direction by replacing an upper epitaxial layer for the first conductivity column with a region for the second conductivity column. At least one of the lower portion and the upper portion of the second conductivity column includes a central portion and an end portion between the central portion and a boundary surface of the lower layer and the upper layer. A width of the end portion, on the boundary surface, in the repeating direction is smaller than a width of the central portion in the repeating direction.

DETAILED DESCRIPTION

Figure 1:
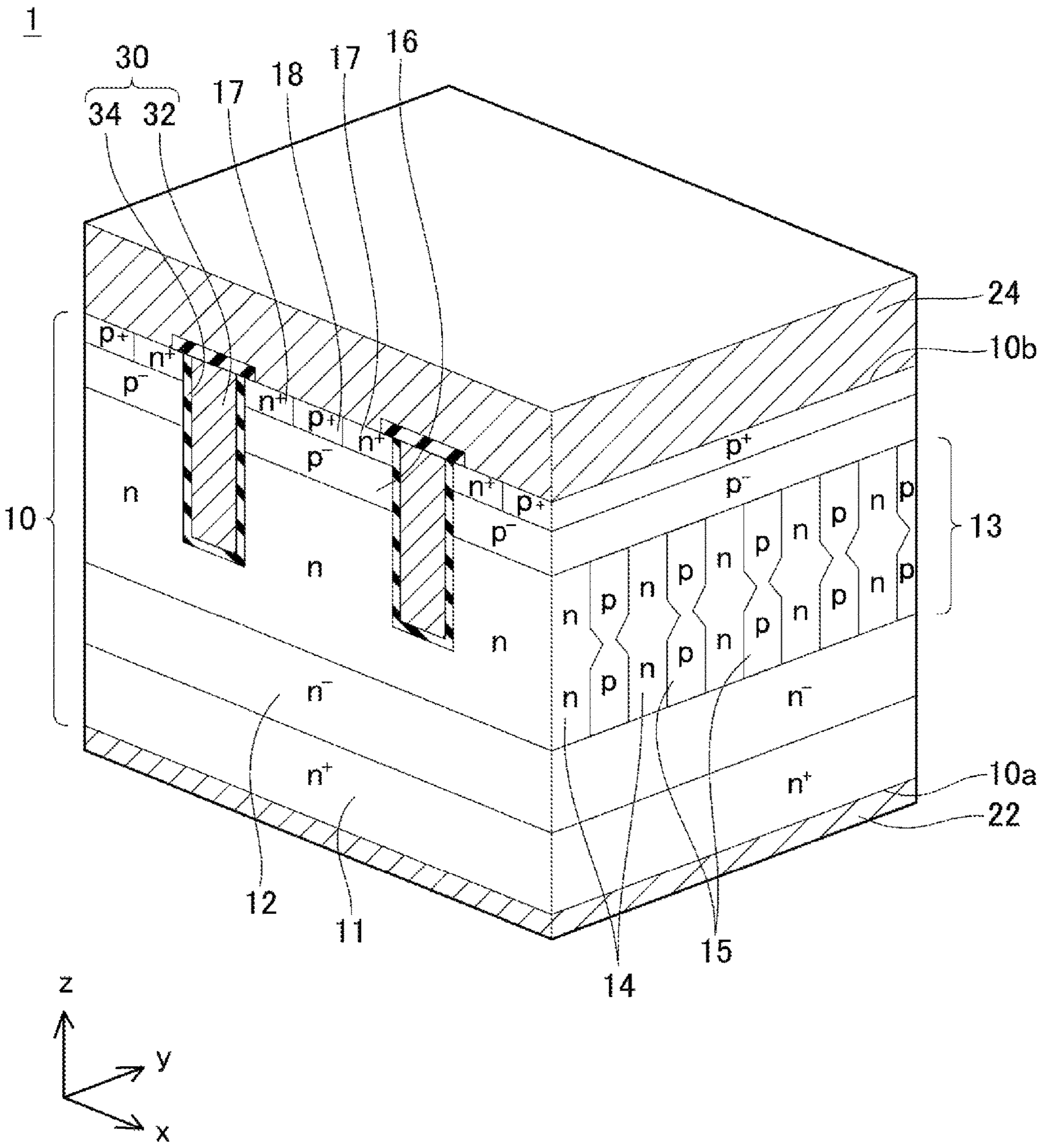
FIG. 1 schematically shows a sectional perspective view of a semiconductor device according to an embodiment.

A semiconductor device may include a repeating layer in which n-type columns and p-type columns are alternately arranged in a semiconductor substrate. Such a repeating layer is needed for various reasons. For example, in order to achieve both low on-resistance and high breakdown voltage of a semiconductor device, a repeating layer called a super junction layer (hereinafter, referred to as an SJ layer) has been developed.

It may be desirable to increase the thickness of the repeating layer. For example, when the repeating layer is an SJ layer, increasing the thickness of the SJ layer can further improve the trade-off relationship between the low on-resistance and the high breakdown voltage of the semiconductor device. However, since the aspect ratio of the n-type column and the p-type column is large in the repeating layer having a large thickness, it is difficult to collectively form the entire repeating layer. Therefore, a manufacturing method of forming the entire repeating layer through plural layering steps has been proposed.

However, if a positional deviation occurs between the lower layer and the upper layer when forming the repeating layer, a narrow portion is formed between the columns at the boundary surface between the lower layer and the upper layer, which may deteriorate the electrical characteristics of the semiconductor device. The present disclosure provides a technique for suppressing deterioration of electrical characteristics in a semiconductor device.

According to an aspect of the present disclosure, a method of manufacturing a semiconductor device having a repeating layer in which a first conductivity column and a second conductivity column are alternately arranged in a repeating direction includes: forming a lower layer of the repeating layer in which a lower portion of the first conductivity column and a lower portion of the second conductivity column are alternately arranged in the repeating direction by replacing a part of a lower epitaxial layer for the first conductivity column with a region for the second conductivity column; and forming an upper layer of the repeating layer on the lower layer, in which an upper portion of the first conductivity column and an upper portion of the second conductivity column are alternately arranged in the repeating direction by replacing a part of an upper epitaxial layer for the first conductivity column with a region for the second conductivity column. At least one of the lower portion and the upper portion of the second conductivity column includes a central portion and an end portion between the central portion and a boundary surface of the lower layer and the upper layer. A width of the end portion, on the boundary surface, in the repeating direction is smaller than a width of the central portion in the repeating direction. The semiconductor device is not particularly limited, but may be, for example, a metal oxide semiconductor field effect transistor (MOSFET) or an insulated gate bipolar transistor (IGBT).

According to the above manufacturing method, a semiconductor device is produced, in which the width of the end portion of at least one of the lower portion and the upper portion of the second conductivity column is reduced. In other words, a semiconductor device is manufactured in which the lower portion of the first conductivity column and the upper portion of the first conductivity column can be connected with each other in a wide area at the interface between the lower layer and the upper layer. Therefore, even if a positional deviation occurs when the upper layer is formed on the lower layer, the lower portion of the first conductivity column and the upper portion of the first conductivity column are well connected at the boundary surface. Therefore, in the semiconductor device manufactured by the above manufacturing method, deterioration of electrical characteristics is suppressed.

According to the present disclosure, a semiconductor device has a repeating layer in which a first conductivity column and a second conductivity column are alternately arranged in a repeating direction. The repeating layer has: a lower layer in which a lower portion of the first conductivity column and a lower portion of the second conductivity column are alternately arranged in the repeating direction; and an upper layer in which an upper portion of the first conductivity column and an upper portion of the second conductivity column are alternately arranged in the repeating direction. At least one of the lower portion and the upper portion of the second conductivity column includes a central portion and an end portion between the central portion and a boundary surface of the lower layer and the upper layer. A width of the end portion, on the boundary surface, in the repeating direction is smaller than a width of the central portion in the repeating direction.

In the semiconductor device, a width of the end portion of at least one of the lower portion and the upper portion of the second conductivity column is narrow. In other words, in the semiconductor device, the lower portion and the upper portion of the first conductivity column can be connected in a wide area at the interface between the lower layer and the upper layer. Therefore, even if a positional deviation occurs when the upper layer is formed on the lower layer, the lower portion and the upper portion of the first conductivity column are favorably connected at the boundary surface. Therefore, the semiconductor device has a structure in which deterioration of electrical characteristics is suppressed.

Hereinafter, embodiments will be described with reference to the drawings. Note that, for the purpose of clarifying the illustration, only some of the repeatedly arranged components are denoted by reference numerals.

As shown in FIG. 1, a semiconductor device 1 is a power device called a MOSFET (metal-oxide-semiconductor field effect transistor), and includes a semiconductor substrate 10. The semiconductor substrate 10 is not particularly limited, but may be made of, for example, silicon carbide (SiC). Alternatively, the semiconductor substrate 10 may be made of another semiconductor material such as silicon, gallium nitride, or gallium oxide.

A drain electrode 22 is formed on the lower surface 10*a* of the semiconductor substrate 10, and a source electrode 24 is formed on the upper surface 10*b* of the semiconductor substrate 10. The semiconductor device 1 is a vertical power device in which a current flows in the thickness direction of the semiconductor substrate 10. The thickness direction of the semiconductor substrate 10 is the z direction. A direction orthogonal to the z direction and parallel to the upper surface 10*b* of the semiconductor substrate 10 is the x direction. A direction orthogonal to the z direction and the x direction is the y direction.

The semiconductor substrate 10 includes a drain region 11, a drift region 12, a repeating layer 13, a body region 16, a source region 17, and a body contact region 18.

The drain region 11 is disposed at a position exposed to the lower surface of the semiconductor substrate 10, and is an n+ region containing an n-type impurity at a high concentration. The drain region 11 is in ohmic contact with the drain electrode 22.

The drift region 12 is disposed between the drain region 11 and the repeating layer 13, and separates the drain region 11 and the repeating layer 13 from each other. The drift region 12 is an n-region having a lower concentration of n-type impurity than the drain region 11.

The repeating layer 13 is disposed between the drift region 12 and the body region 16, and separates the drift region 12 and the body region 16 from each other. The repeating layer 13 includes plural n-type columns 14 and plural p-type columns 15. When viewed in the z direction orthogonal to the upper surface 10*b* of the semiconductor substrate 10 (hereinafter, referred to as "when viewed in a plan view"), the repeating layer 13 is configured such that the n-type columns 14 and the p-type columns 15 are alternately and repeatedly arranged along the repeating direction (in the y direction).

Each of the n-type columns 14 has a lower end in contact with the drift region 12 and an upper end in contact with the body region 16. The concentration of the n-type impurity in the n-type column 14 is higher than the concentration of the n-type impurity in the drift region 12. Each of the p-type columns 15 has a lower end in contact with the drift region 12 and an upper end in contact with the body region 16. The concentration of the p-type impurity in the p-type column 15 is higher than the concentration of the p-type impurity in the body region 16. The combination of the n-type columns 14 and the p-type columns 15 is configured such that charges are balanced when the semiconductor device 1 is turned off, as an SJ layer.

The body region 16 is disposed on the upper side of the repeating layer 13 and separates the repeating layer 13 and the source region 17 from each other. Further, the body region 16 separates the repeating layer 13 from the body contact region 18. A channel is formed in the body region 16 when the semiconductor device 1 is turned on.

The source region 17 is disposed at a position exposed to the upper surface 10*b* of the semiconductor substrate 10, as n+ region containing an n-type impurity at a high concentration. The source region 17 is in ohmic contact with the source electrode 24.

The body contact region 18 is disposed at a position exposed to the upper surface 10*b* of the semiconductor substrate 10, as p+ region containing a p-type impurity at a high concentration. The body contact region 18 is in ohmic contact with the source electrode 24.

The semiconductor device 1 further includes trench gates 30. Each of the trench gates 30 is formed to penetrate the source region 17 and the body region 16 from the upper surface 10*b* of the semiconductor substrate 10 to the repeating layer 13. Each of the trench gates 30 extends in parallel with the repeating direction (the y direction) of the repeating layer 13 when the semiconductor substrate 10 is viewed in a plan view.

Each of the trench gates 30 includes a gate electrode 32 and a gate insulating film 34. The gate electrode 32 is insulated from the semiconductor substrate by the gate insulating film 34, and is insulated from the source electrode 24 by the interlayer insulating film. The source region 17 and the body region 16 are in contact with the side surface of the trench gate 30. The n-type column 14 and the p-type column 15 of the repeating layer 13 are in contact with the side surface and the bottom surface of the trench gate 30.

Figure 2:
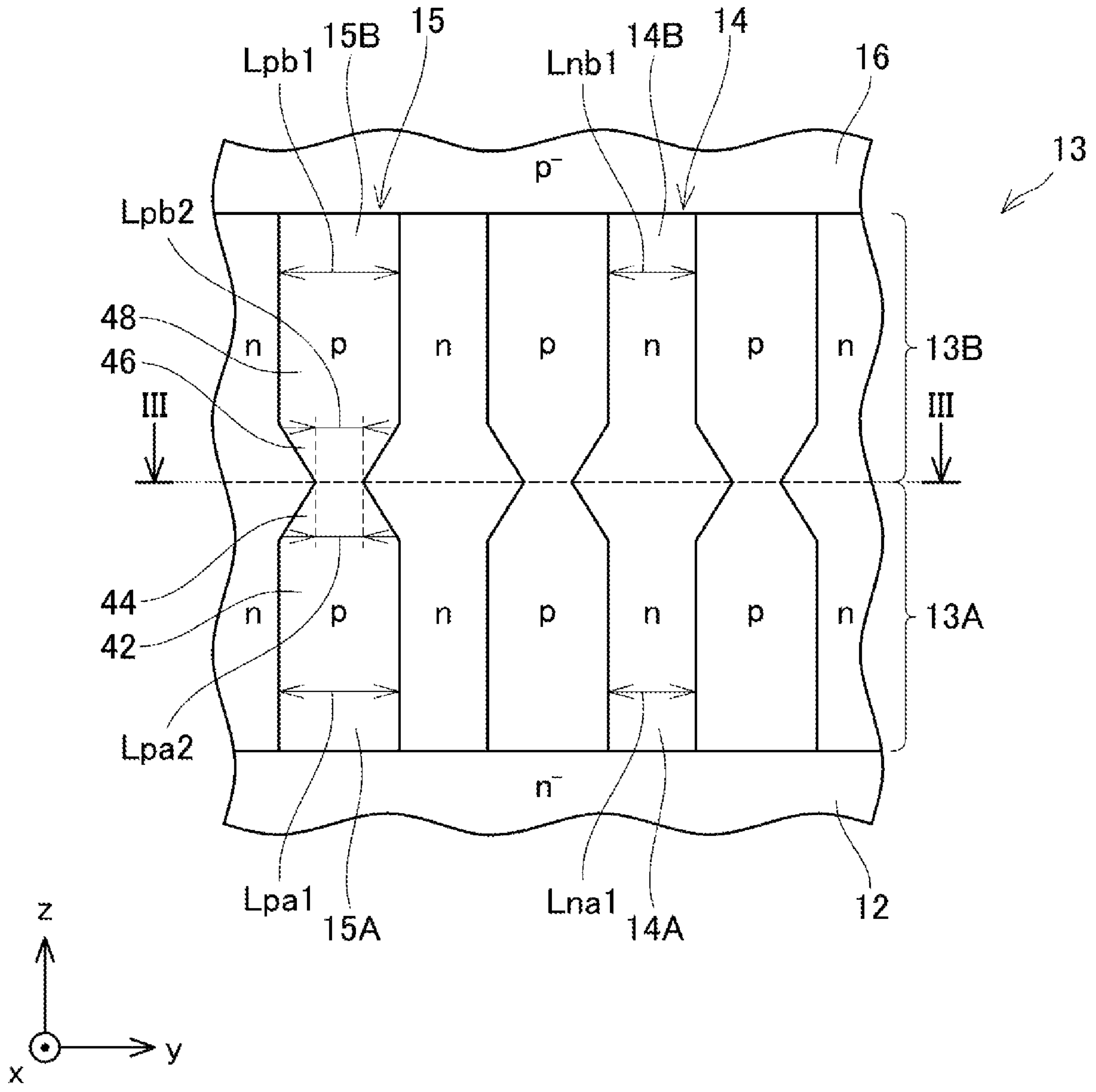
FIG. 2 schematically shows an enlarged sectional view of a repeating layer in the semiconductor device.

FIG. 2 is an enlarged sectional view of a main part of the repeating layer 13 obtained by taking along a plane (the yz plane) parallel to the repeating direction (the y direction) and the thickness direction (the z direction). The repeating layer 13 includes a lower layer 13A and an upper layer 13B. As will be described in detail in the manufacturing method to be described later, each of the lower layer 13A and the upper layer 13B is a unit of layers when the repeating layer 13 is formed. In this example, the repeating layer 13 is formed through two layering steps. Instead of this example, the repeating layer 13 may be formed through three or more layering steps.

Each of the n-type columns 14 has a lower portion 14A corresponding to the lower layer 13A and an upper portion 14B corresponding to the upper layer 13B. Similarly, each of the p-type columns 15 includes a lower portion 15A corresponding to the lower layer 13A and an upper portion 15B corresponding to the upper layer 13B. As described above, the lower layer 13A is configured such that the lower portion 14A and the lower portion 15A are alternately and repeatedly arranged along the repeating direction (in the y direction). Similarly, the upper layer 13B is configured such that the upper portion 14B and the upper portion 15B are alternately and repeatedly arranged along the repeating direction (in the y direction). Hereinafter, when there is a description of a "width", it refers to a width measured along the repeating direction (in the y direction).

The lower portion 15A has a central portion 42 and an end portion 44. The central portion 42 is located at the central side of the lower portion 15A, and has a width Lpa1 which is substantially constant in the thickness direction (the z direction). More specifically, the central portion 42 has a pair of side surfaces facing each other in the repeating direction (the y direction), which are parallel to the thickness direction (the z direction). The central portion 42 has the maximum width in the lower portion 15A. The end portion 44 is located adjacent to the end of the lower portion 15A, provided between the central portion 42 and a boundary surface (indicated by a broken line) between the lower layer 13A and the upper layer 13B. The side surfaces of the end portion 44 facing in the repeating direction (the y direction) are located inward of the side surfaces of the central portion 42 facing in the repeating direction (the y direction). The end portion 44 has a tapered shape from the central portion 42 toward the boundary surface. Therefore, the width Lpa2 of the end portion 44 at the boundary surface is smaller than the width Lpa1 of the central portion 42.

The upper portion 15B has a central portion 48 and an end portion 46. The central portion 48 is located on the central side of the upper portion 15B, and has the width Lpb1 that is substantially constant in the thickness direction (the z direction). More specifically, the central portion 48 has a pair of side surfaces facing each other in the repeating direction (the y direction), which are parallel to the thickness direction (the z direction). The central portion 48 has the maximum width in the upper portion 15B. The end portion 46 is located adjacent to the end of the upper portion 15B, and is provided between the central portion 48 and the boundary surface (indicated by a broken line) between the lower layer 13A and the upper layer 13B. The side surfaces of the end portion 46 facing in the repeating direction (the y direction) are located inward of the side surfaces of the central portion 48 facing in the repeating direction (the y direction). The end portion 46 has a tapered shape from the central portion 48 toward the boundary surface. Therefore, the width Lpb2 of the end portion 46 at the boundary surface is smaller than the width Lpb1 of the central portion 48.

As will be described later, the lower portion 14A is formed as the remaining portion after the lower portion 15A is formed, and has a shape corresponding to the shape of the adjacent lower portion 15A. Therefore, a part of the lower portion 14A adjacent to the central portion 42 of the lower portion 15A has the constant width Lna1, and a part of the lower portion 14A adjacent to the end portion 44 of the lower portion has a width gradually increasing toward the boundary surface.

Similarly, the upper portion 14B has a shape corresponding to the shape of the adjacent upper portion 15B. A part of the upper portion 14*b* adjacent to the central portion 48 of the upper portion 15B has the constant width Lnb1, and a part of the upper portion 14*b* adjacent to the end portion 46 of the upper portion 15B has a width gradually increasing toward the boundary surface.

Both the width Lna1 of the lower portion 14A and the width Lnb1 of the upper portion 14B are larger than the width Lpa2, Lpb2 of the end portion 44, 46 of the p-type column 15. The width Lna1 of the lower portion 14A and the width Lnb1 of the upper portion 14B are not particularly limited, and may be, for example, in the range of 0.1 to 1.0 μm.

Figure 3:
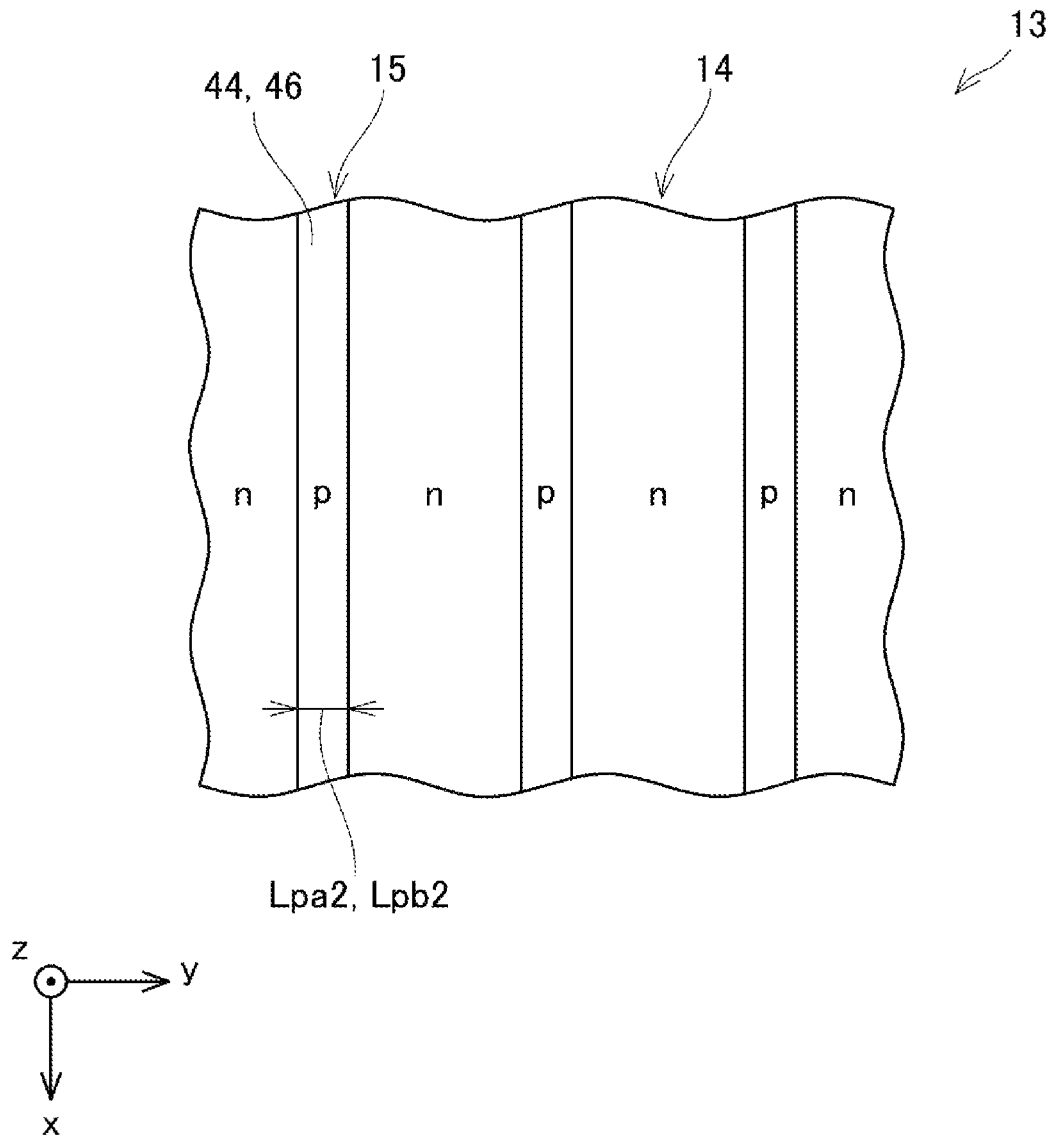
FIG. 3 is an enlarged schematic sectional view taken along a line III-III in FIG. 2.

FIG. 3 shows an enlarged sectional view of a main part of the repeating layer 13 obtained by taking along the line III-III in FIG. 2, corresponding to the boundary surface between the lower layer 13A and the upper layer 13B. As shown in FIG. 3, the width Lpa2, Lpb2 of the end portion 44, 46 of the p-type column 15 are both constant along the longitudinal direction (in the x direction) of the p-type column 15.

Figure 4:
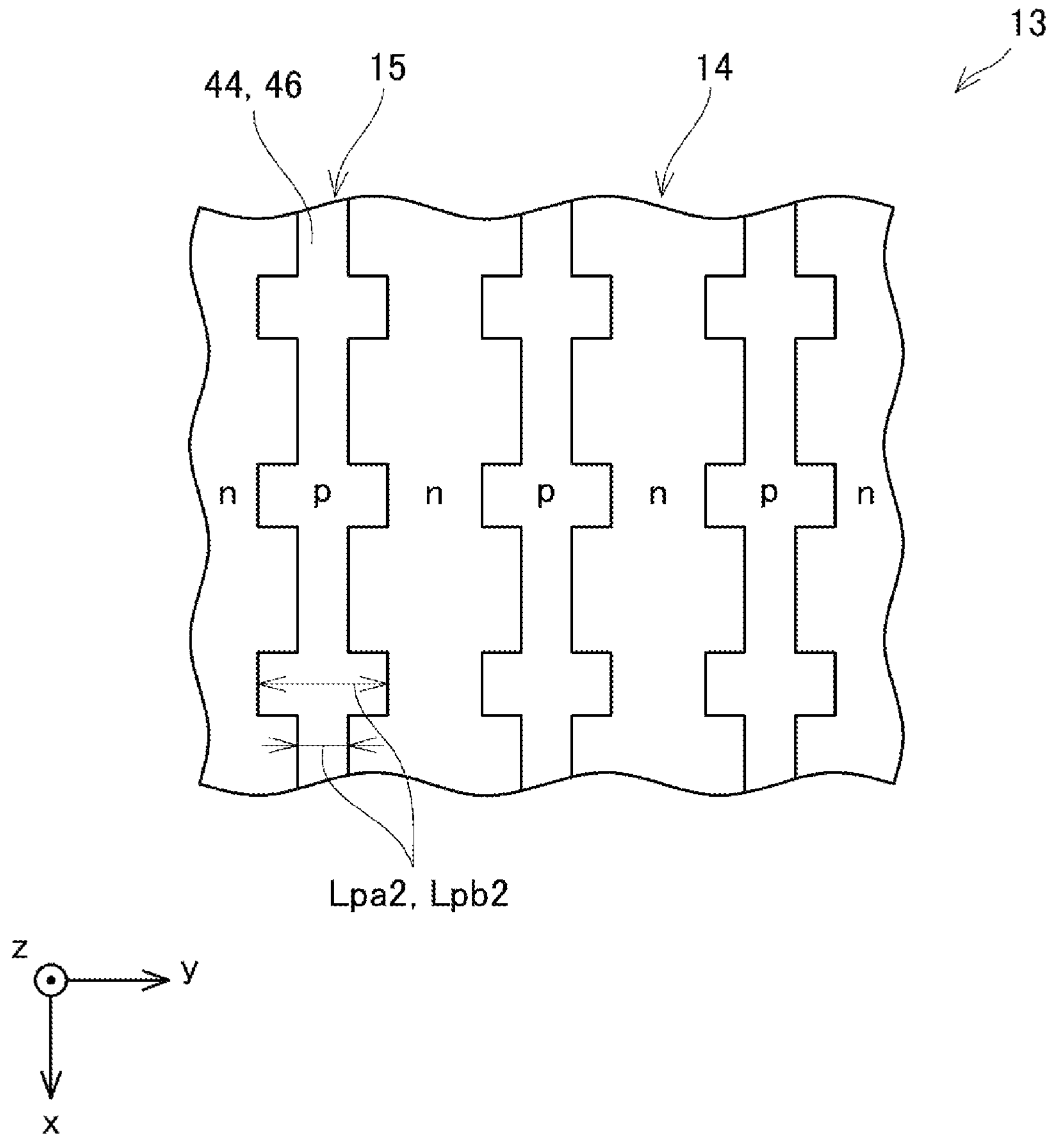
FIG. 4 is an enlarged schematic sectional view in a modification of the embodiment, taken along a line III-III in FIG. 2.

Alternatively, as shown in FIG. 4, the width Lpa2, Lpb2 of the end portion 44, 46 of the p-type column 15 may vary as extending along the longitudinal direction (in the x direction) of the p-type column 15. In other words, the end portion 44, 46 of the p-type column 15 may have wide portions distributed along the longitudinal direction (in the x direction) of the p-type column 15. The wide portions of the end portion 44, 46 of the p-type column 15 may be periodically arranged along the longitudinal direction (in the x direction) of the p-type column 15. Further, the wide portion of the end portion 44, 46 of the p-type column 15 may have the same width as the width Lpa1, Lpb1 of the central portion 42, 48.

When the end portion 44, 46 of the p-type column 15 has such wide portions, the lower portion 15A and the upper portion 15B can be in contact with each other in a wide area. Therefore, when the built-in diode of the semiconductor device 1 is turned off, the hole carriers accumulated in the drift region 12 can be efficiently discharged to the source electrode 24. The wide portions of the end portion 44, 46 of the p-type columns 15 are arranged so as to coincide with each other in the repeating direction (the y direction). Alternatively, the wide portion of the end portion 44, 46 of the p-type columns 15 may be arranged so as not to coincide in the repeating direction (the y direction). Further, the wide portion of the end portion 44, 46 of the p-type columns 15 adjacent to each other may be connected to each other.

Next, the operation of the semiconductor device 1 will be described. The semiconductor device 1 is used in a state where a potential higher than that of the source electrode 24 is applied to the drain electrode 22. When a potential equal to or higher than the gate threshold is applied to the gate electrode 32, a channel is formed in the body region 16 in the vicinity of the gate insulating film 34, and the source region 17 and the n-type column 14 are connected via the channel. Accordingly, electrons flow from the source region 17 to the drain region 11 via the channel, the n-type column 14, and the drift region 12. When the potential of the gate electrode 32 is reduced from a value equal to or more than a gate threshold value to a value less than the gate threshold value, the channel disappears and the flow of electrons stops. Thus, the semiconductor device 1 can operate as a switching element.

Figure 5:
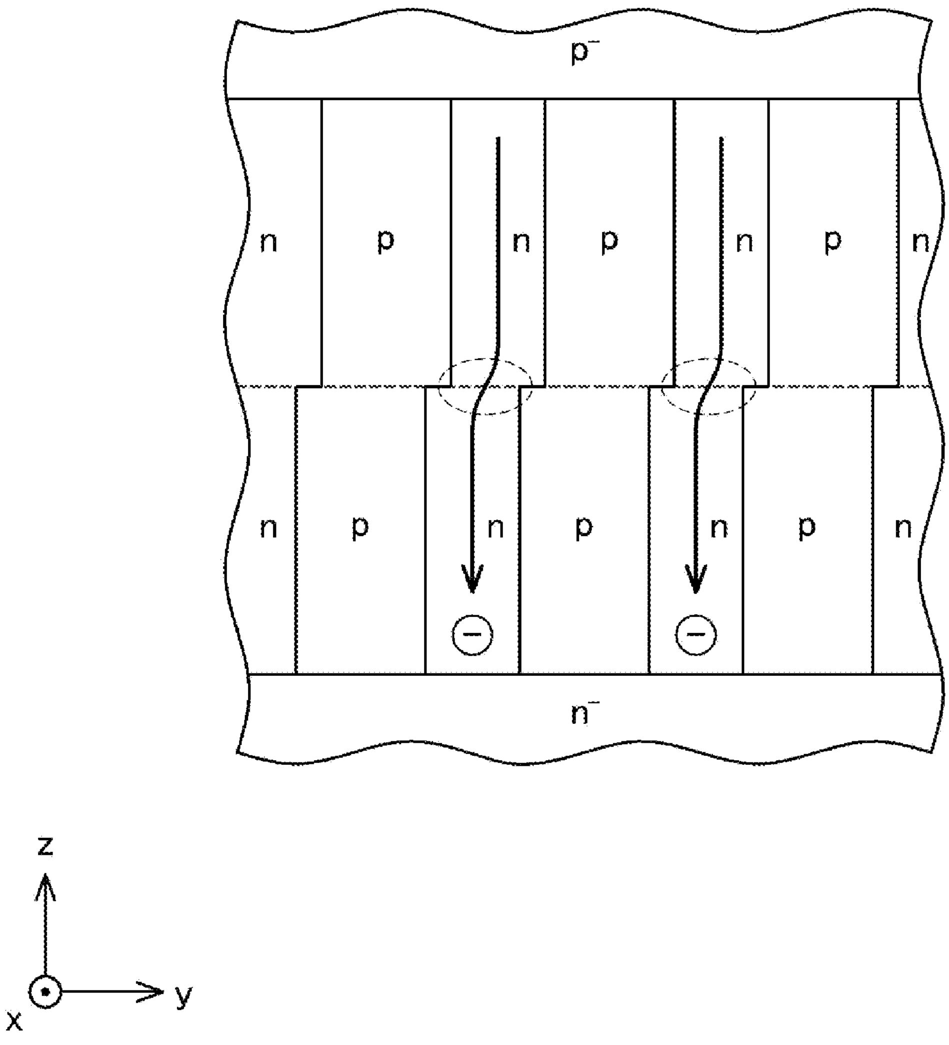
FIG. 5 is a diagram schematically illustrating an enlarged sectional view of a repeating layer in a conventional semiconductor device, in which a current path is narrowed when a positional deviation occurs between a lower layer and an upper layer.
Figure 6:
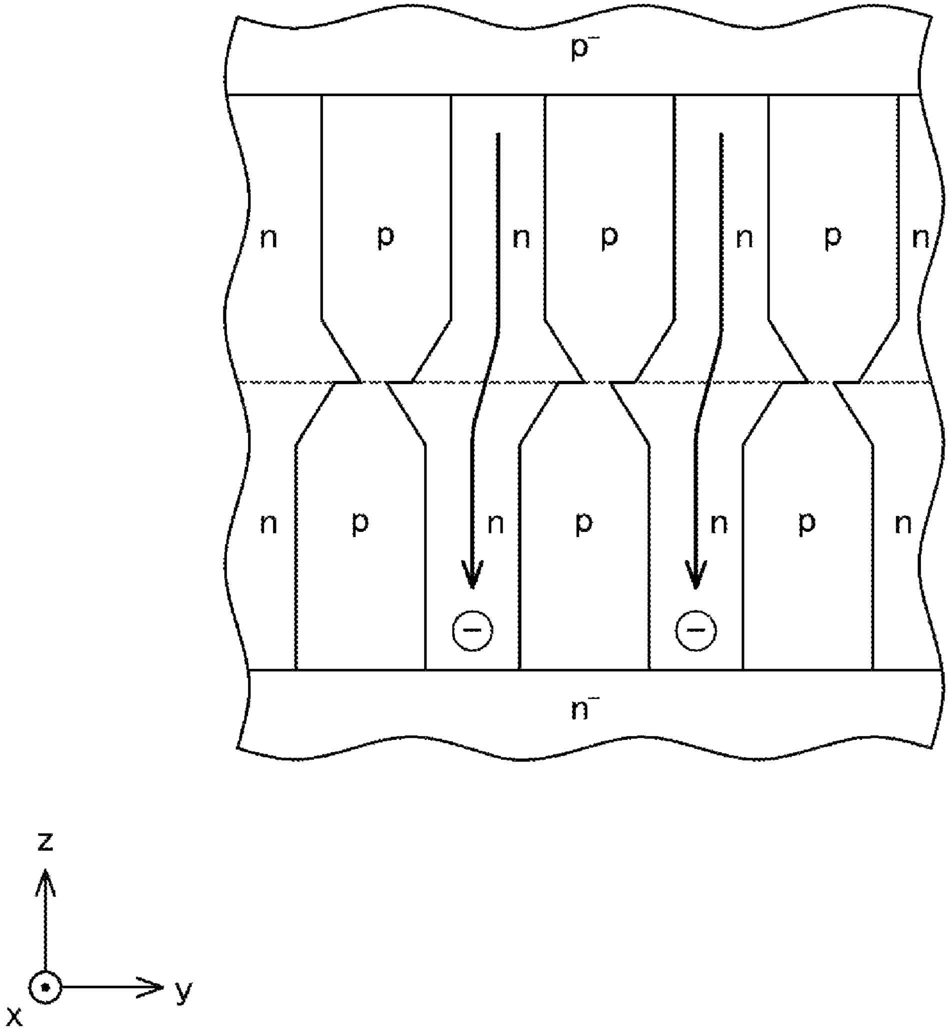
FIG. 6 is a diagram schematically illustrating an enlarged sectional view of the repeating layer in the embodiment, in which a current path is secured when a positional deviation occurs between a lower layer and an upper layer.

The operation and effect of the semiconductor device 1 will be described with reference to FIGS. 5 and 6, in which reference numerals are omitted for the sake of clarity. FIGS. 5 and 6 are sectional views corresponding to FIG. 2. FIG. 5 shows a repeating layer of the semiconductor device in a comparative example, and FIG. 6 shows a repeating layer of the semiconductor device of the present embodiment. FIGS. 5 and 6 show a positional deviation along the repeating direction (in the y direction) when the upper layer is formed on the lower layer.

In the comparative example shown in FIG. 5, each width of the n-type column and the p-type column constituting the repeating layer 13 is constant in the thickness direction. In such a comparative example, when positional deviation occurs, a narrow portion (indicated by a broken line) is formed between the lower portion and the upper portion of the n-type column at the boundary surface. The lower portion and the upper portion of the n-type column are paths through which current flows when the semiconductor device 1 is turned on. For this reason, when a positional deviation occurs and a narrow portion is formed between the lower portion and the upper portion of the n-type column, the on-resistance of the semiconductor device 1 is significantly increased.

According to the present embodiment shown in FIG. 6, the lower portion and the upper portion 15B of the p-type column respectively have the narrow end portion 44 and the narrow end portion 46. In other words, each of the lower portion and the upper portion of the n-type column is formed to be wide at the boundary surface. Therefore, the lower portion and the upper portion of the n-type column can be connected to each other in a wide area at the boundary surface. Therefore, even if the positional deviation occurs, a narrow portion is not formed between the lower portion 14A and the upper portion 14B of the n-type column at the boundary surface, and the connection between the lower portion 14A and the upper portion 14B is favorably maintained. As a result, the semiconductor device 1 has a structure in which robustness against positional deviation is high and deterioration of electrical characteristics is suppressed.

The deterioration in the electrical characteristics due to the positional deviation between the lower layer 13A and the upper layer 13B becomes apparent when the width of the n-type column 14 is small. For example, when the width Lna1, Lnb1 of the n-type column is less than 1.0 μm, the deterioration in the electrical characteristics due to the positional deviation becomes obvious. Therefore, the technique disclosed herein is particularly useful when the width Lna1, Lnb1 of the n-type column is less than 1.0 μm.

The positional deviation between the lower layer 13A and the upper layer 13B is greatly affected by the positional deviation amount of the alignment mark. In case where silicon carbide is used for the semiconductor substrate 10, the amount of positional deviation of the alignment mark increases due to the influence of the off angle (for example, 4 degrees) of the semiconductor substrate when epitaxially grown on the alignment mark. Such positional deviation of the alignment mark may occur when the upper layer 13B is formed on the lower layer 13A. Therefore, the technique disclosed herein is particularly useful when silicon carbide is used for the semiconductor substrate 10.

In the present embodiment, each of the lower portion 15A and the upper portion 15B of the p-type column has the narrow end portion 44, 46. Alternatively, one of the lower portion 15A and the upper portion 15B may have a narrow end portion. Even in this case, it is possible to suppress deterioration of electrical characteristics when positional deviation occurs.

In the embodiment, the end portion 44, 46 of the lower portion 15A and the upper portion 15B has a tapered shape toward the boundary surface. As the shape of the end portion 44, 46, various shapes can be adopted while the width Lpa2, Lpb2 of the end portion 44, 46 at the boundary surface is smaller than the width Lpa1, Lpb1 of the central portion 42, 48.

Figure 7:
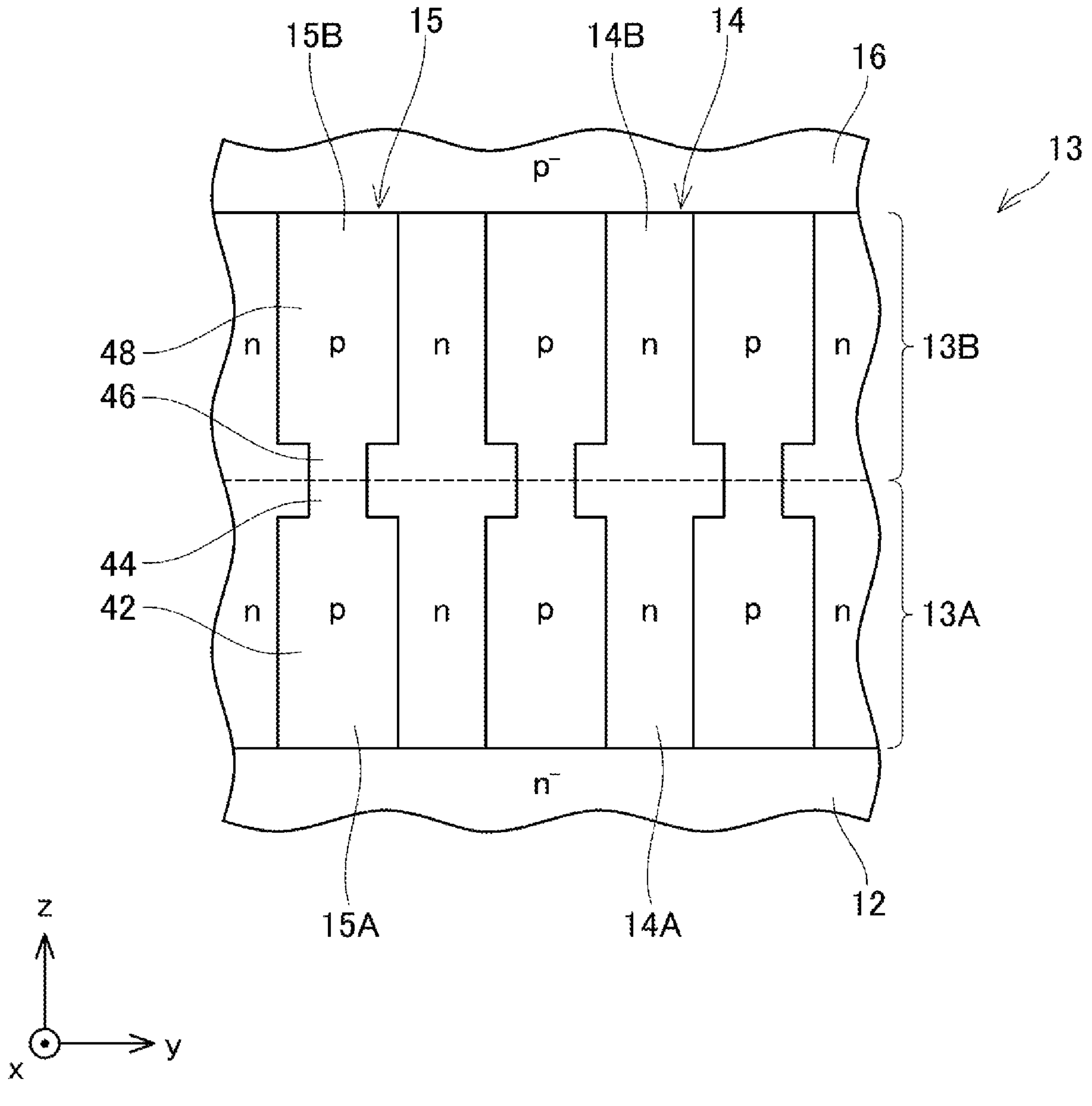
FIG. 7 schematically shows an enlarged sectional view of a repeating layer in a modification of the embodiment.
Figure 8:
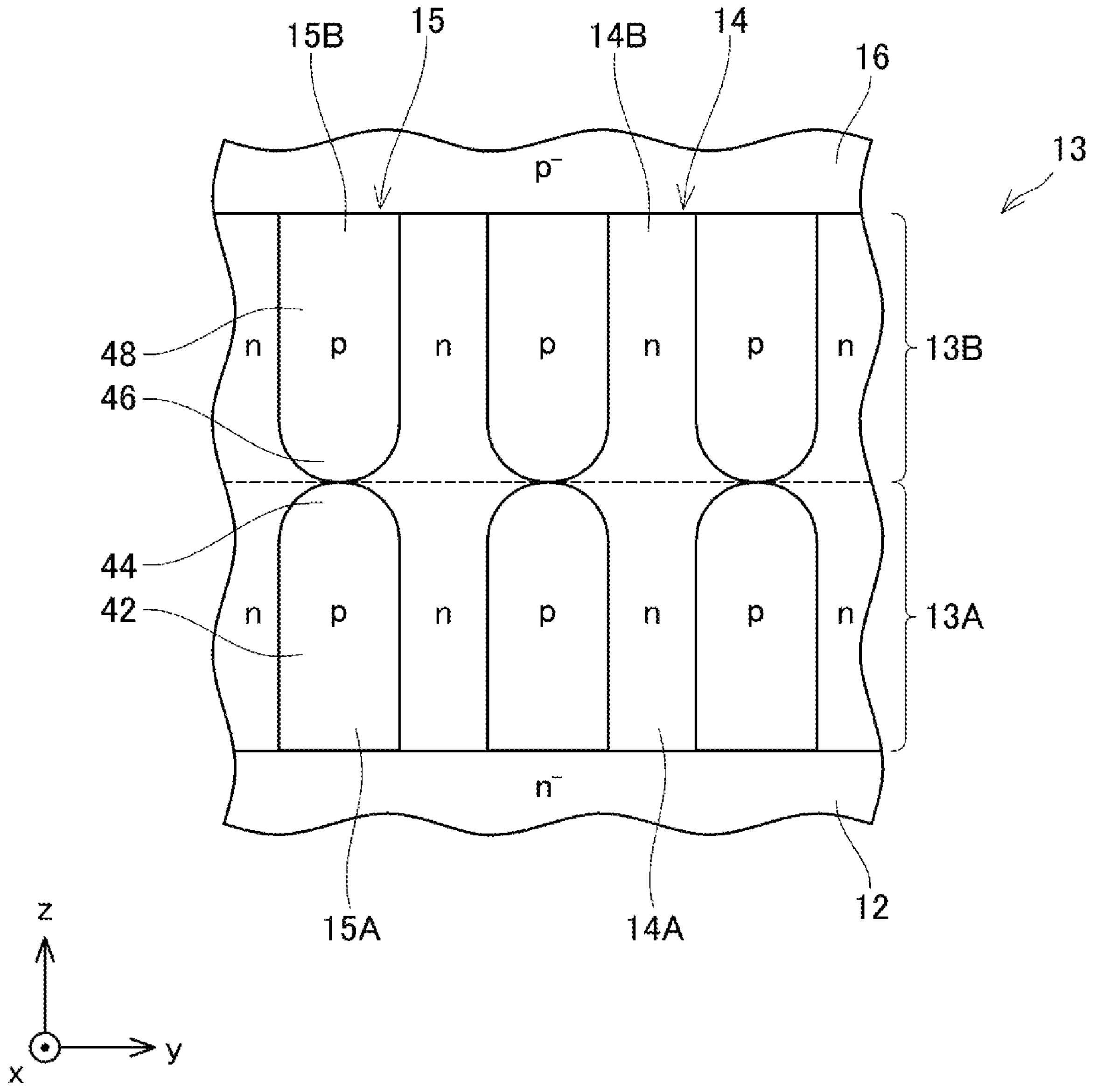
FIG. 8 schematically shows an enlarged sectional view of a repeating layer in a modification of the embodiment.
Figure 9:
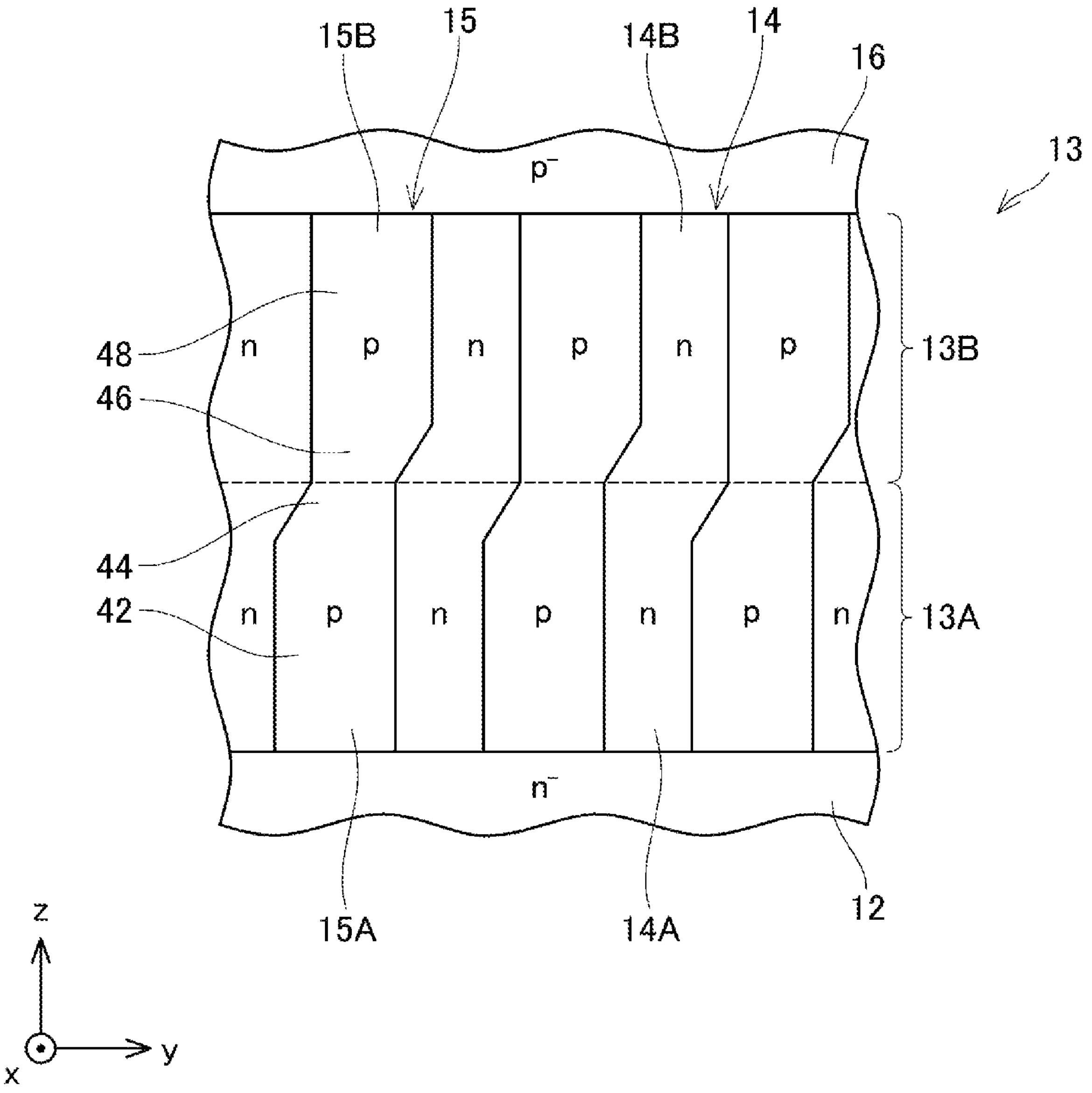
FIG. 9 schematically shows an enlarged sectional view of a repeating layer in a modification of the embodiment.

For example, the shapes of the side surfaces of the end portions 44 and 46 may not be symmetrical. As shown in FIG. 7, the end portion 44, 46 of the lower portion 15A and the upper portion 15B may have a shape in which the width thereof is constant along the thickness direction (in the z direction). As shown in FIG. 8, the end portion 44, 46 of the lower portion 15A and the upper portion 15B may have a rounded shape toward the boundary surface. As shown in FIG. 9, the end portion 44, 46 of the lower portion 15A and the upper portion 15B may have a shape in which only one side surface is positioned inward of the side surface of the central portion 42, 48. In other words, one side surface of the end portion 44, 46 of the lower portion 15A and the upper portion 15B may be flush with the side surface of the central portion 42, 48. In the structure shown in FIG. 9, the lower portion 15A and the upper portion 15B are configured asymmetrically with respect to the boundary surface. Alternatively, the lower portion 15A and the upper portion 15B may be configured symmetrically with respect to the boundary surface.

Figure 10:
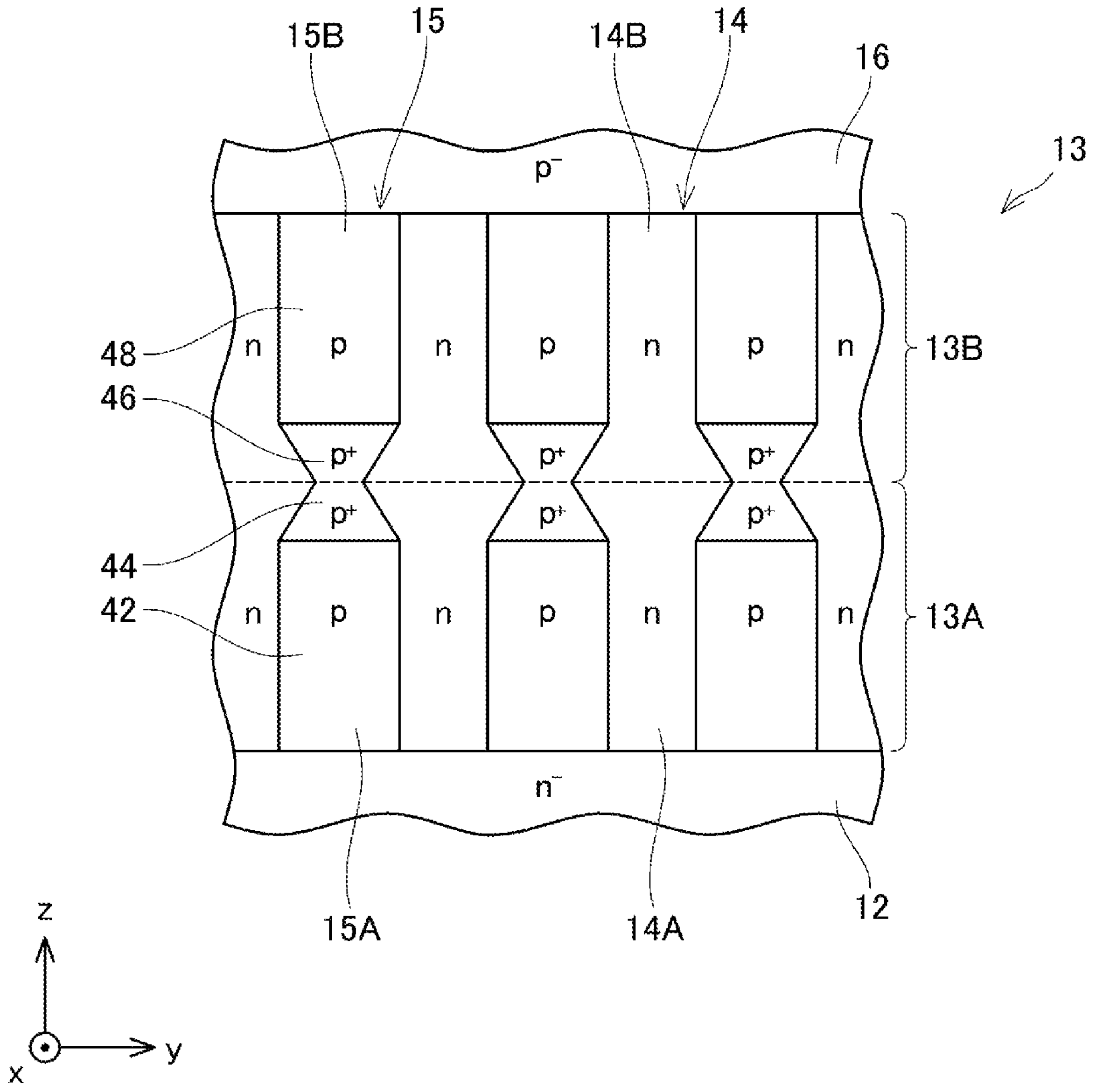
FIG. 10 schematically shows an enlarged sectional view of a repeating layer in a modification of the embodiment.

In the embodiment, the concentration of the p-type impurity in the end portion 44, 46 of the lower portion 15A and the upper portion 15B is not particularly mentioned. As shown in FIG. 10, the concentration of the p-type impurity in the end portion 44, 46 of the lower portion 15A and the upper portion 15B may be higher than the concentration of the p-type impurity in the central portion 42, 48. When the concentration of the p-type impurity in the end portion 44, 46 of the p-type column 15 is high, an increase in resistance due to the narrow end portion 44, 46 can be suppressed. Therefore, when the built-in diode of the semiconductor device 1 is turned off, the hole carriers accumulated in the drift region 12 can be efficiently discharged to the source electrode 24.

Next, some methods for forming a repeating layer to manufacture the semiconductor device 1 will be described.

(First Manufacturing Method)

Figure 11:
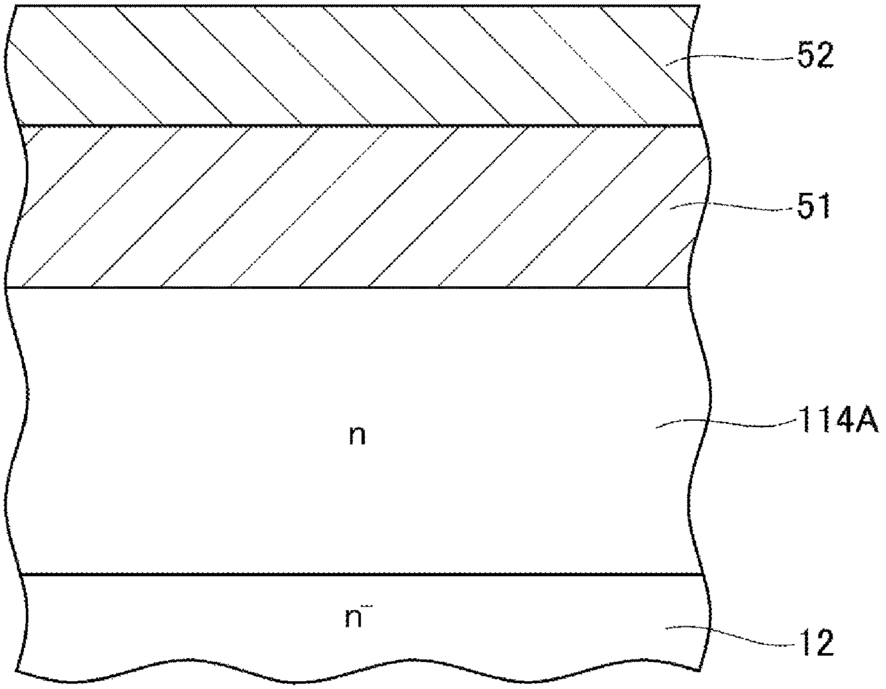
FIG. 11 schematically shows an enlarged sectional view of the repeating layer in the embodiment in a process of a first manufacturing method.

The first manufacturing method is to form the repeating layer 13 shown in FIG. 2. First, as shown in FIG. 11, an n-type lower epitaxial layer 114A is formed on the drift region 12. Next, a mask film 51 and a photoresist film 52 are formed on the n-type lower epitaxial layer 114A.

Figure 12:
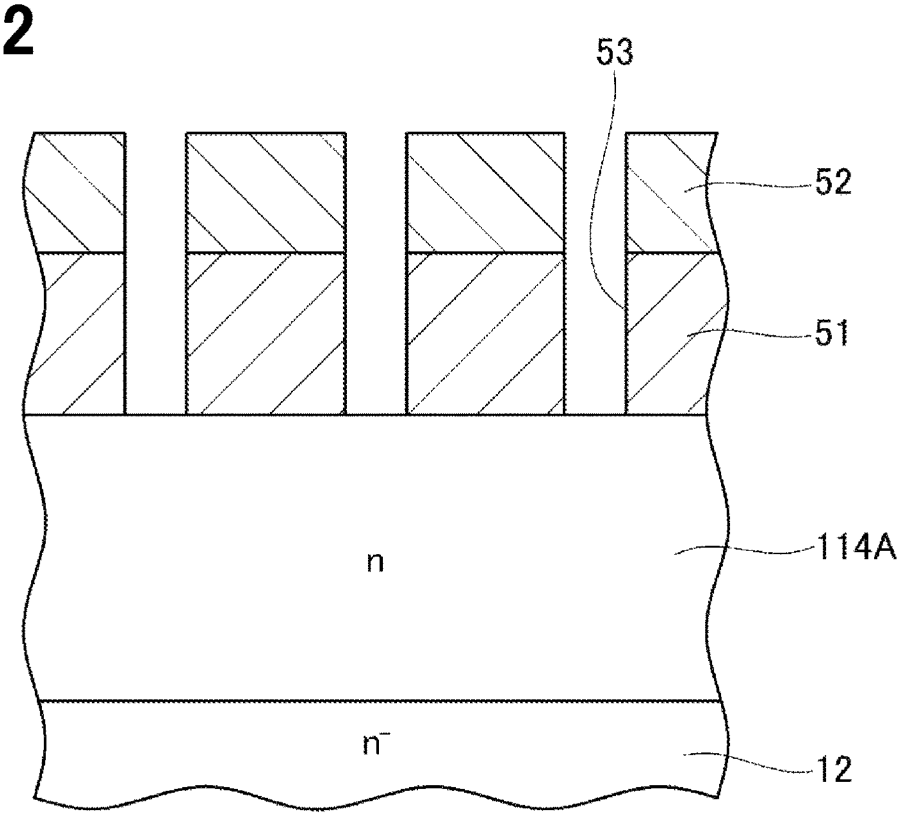
FIG. 12 schematically shows an enlarged sectional view of the repeating layer in the embodiment in a process of the first manufacturing method.

Next, as shown in FIG. 12, after the photoresist film 52 is patterned, an opening 53 is formed in the mask film 51 by using a dry etching technique. The upper surface of the n-type lower epitaxial layer 114A is exposed from the bottom surface of the opening 53.

Figure 13:
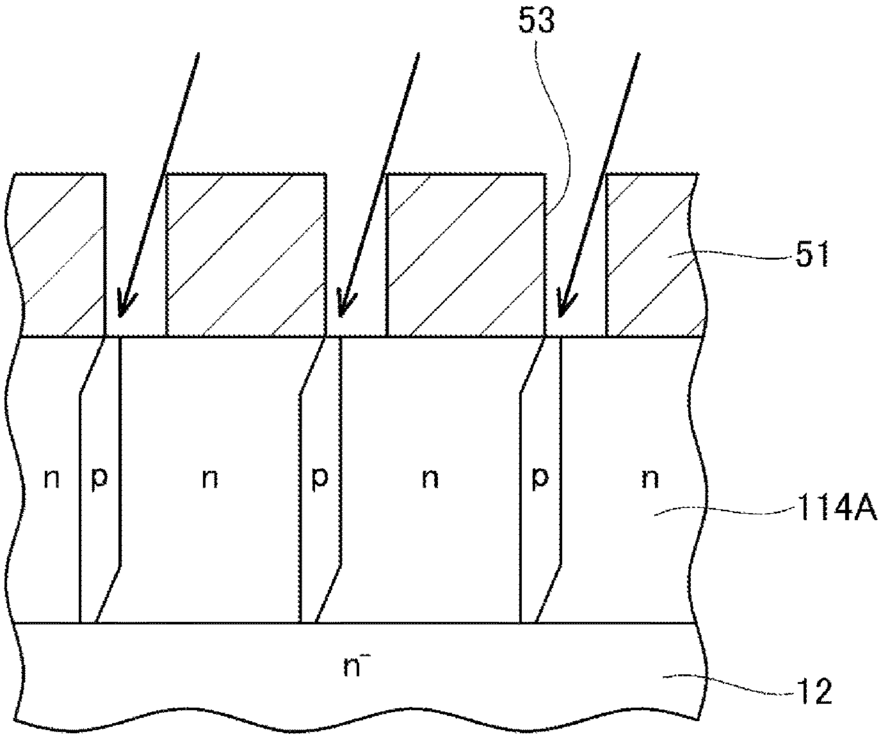
FIG. 13 schematically shows an enlarged sectional view of the repeating layer in the embodiment in a process of the first manufacturing method.
Figure 14:
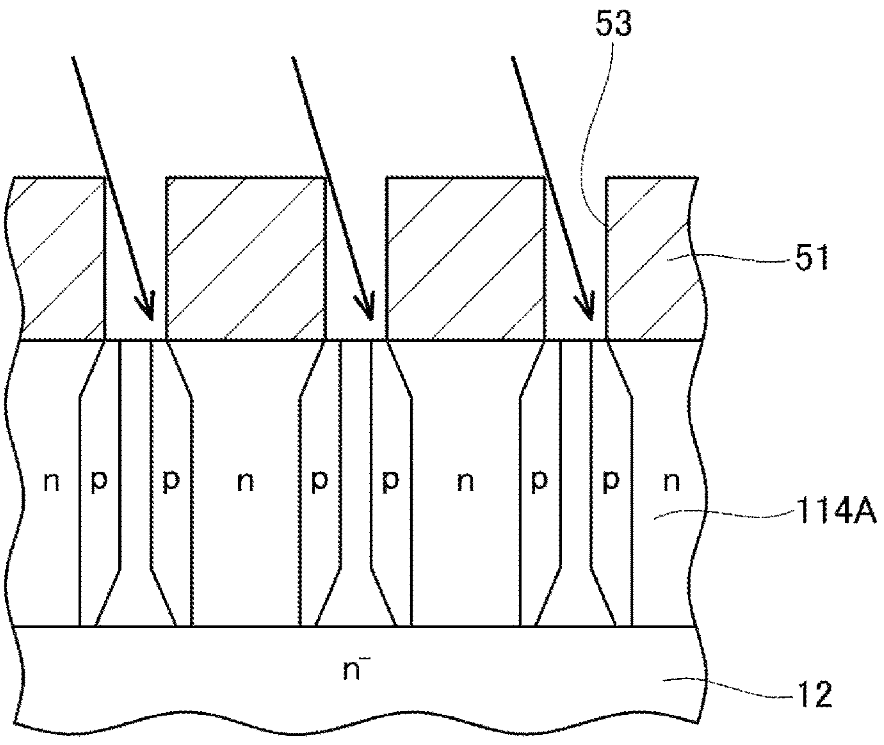
FIG. 14 schematically shows an enlarged sectional view of the repeating layer in the embodiment in a process of the first manufacturing method.

Next, as shown in FIGS. 13 and 14, p-type ions are implanted into the n-type lower epitaxial layer 114A through the opening 53 of the mask film 51 by using an ion implantation technique. The ion implantation angle is set as an oblique direction with respect to the upper surface of the n-type lower epitaxial layer 114A.

Figure 15:
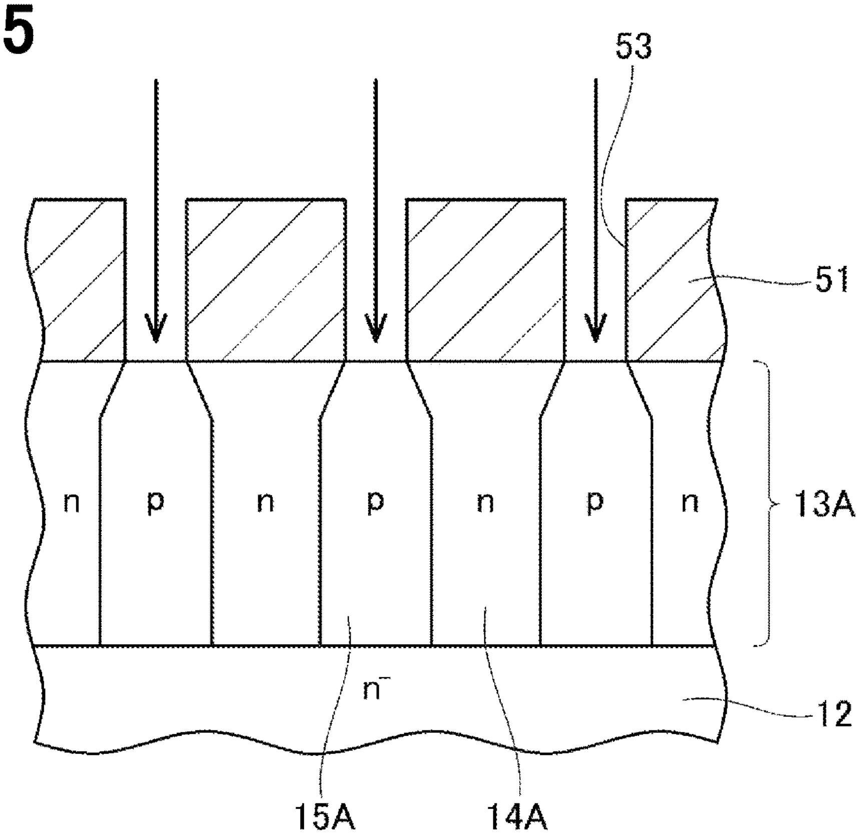
FIG. 15 schematically shows an enlarged sectional view of the repeating layer in the embodiment in a process of the first manufacturing method.

Next, as shown in FIG. 15, p-type ions are implanted into the n-type lower epitaxial layer 114A through the opening 53 of the mask film 51 by using an ion implantation technique. The ion implantation angle is set correspond to a direction perpendicular to the upper surface of the n-type lower epitaxial layer 114A. In this manner, by performing ion implantation plural times under different ion implantation conditions, the lower portions 15A are formed in the n-type lower epitaxial layer 114A. In addition, the lower portions 14A are formed in the remaining portion of the n-type lower epitaxial layer 114A after the lower portions 15A are formed. As a result, the lower layer 13A including the lower portions 15A and the lower portions 14A is formed.

Figure 16:
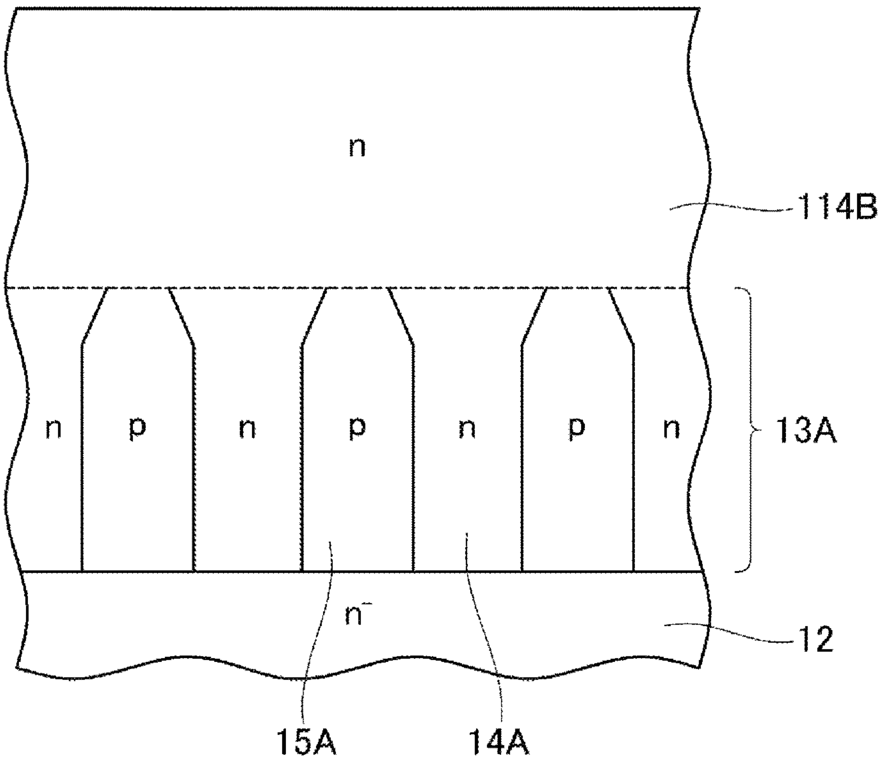
FIG. 16 schematically shows an enlarged sectional view of the repeating layer in the embodiment in a process of the first manufacturing method.

Next, as shown in FIG. 16, after the mask film 51 is removed, an n-type upper epitaxial layer 114B is formed on the lower layer 13A by using an epitaxial growth technique. As described above, in this step, the amount of positional deviation of the alignment mark may increase.

Figure 17:
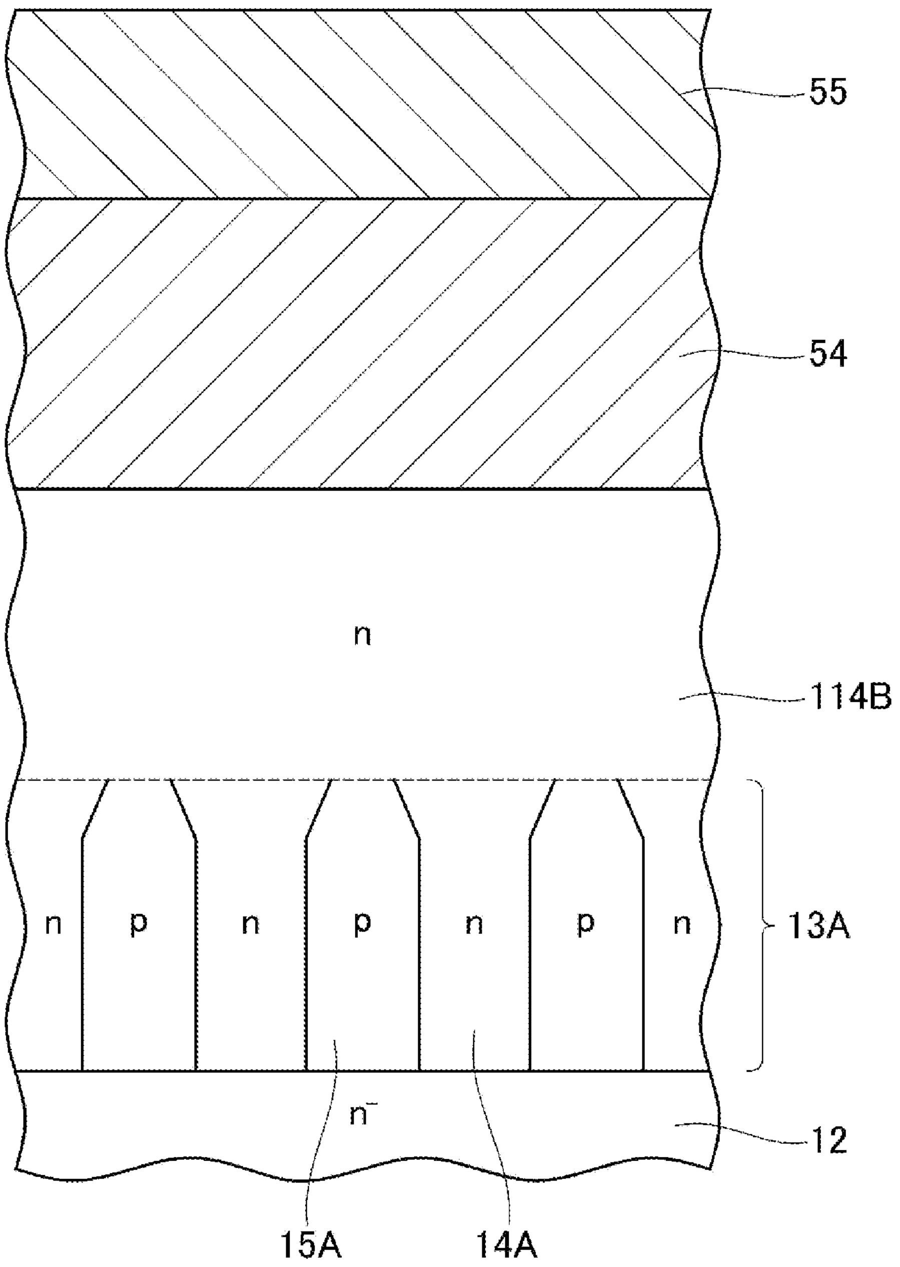
FIG. 17 schematically shows an enlarged sectional view of the repeating layer in the embodiment in a process of the first manufacturing method.

Next, as shown in FIG. 17, a mask film 54 and a photoresist film 55 are formed on the n-type upper epitaxial layer 114B.

Figure 18:
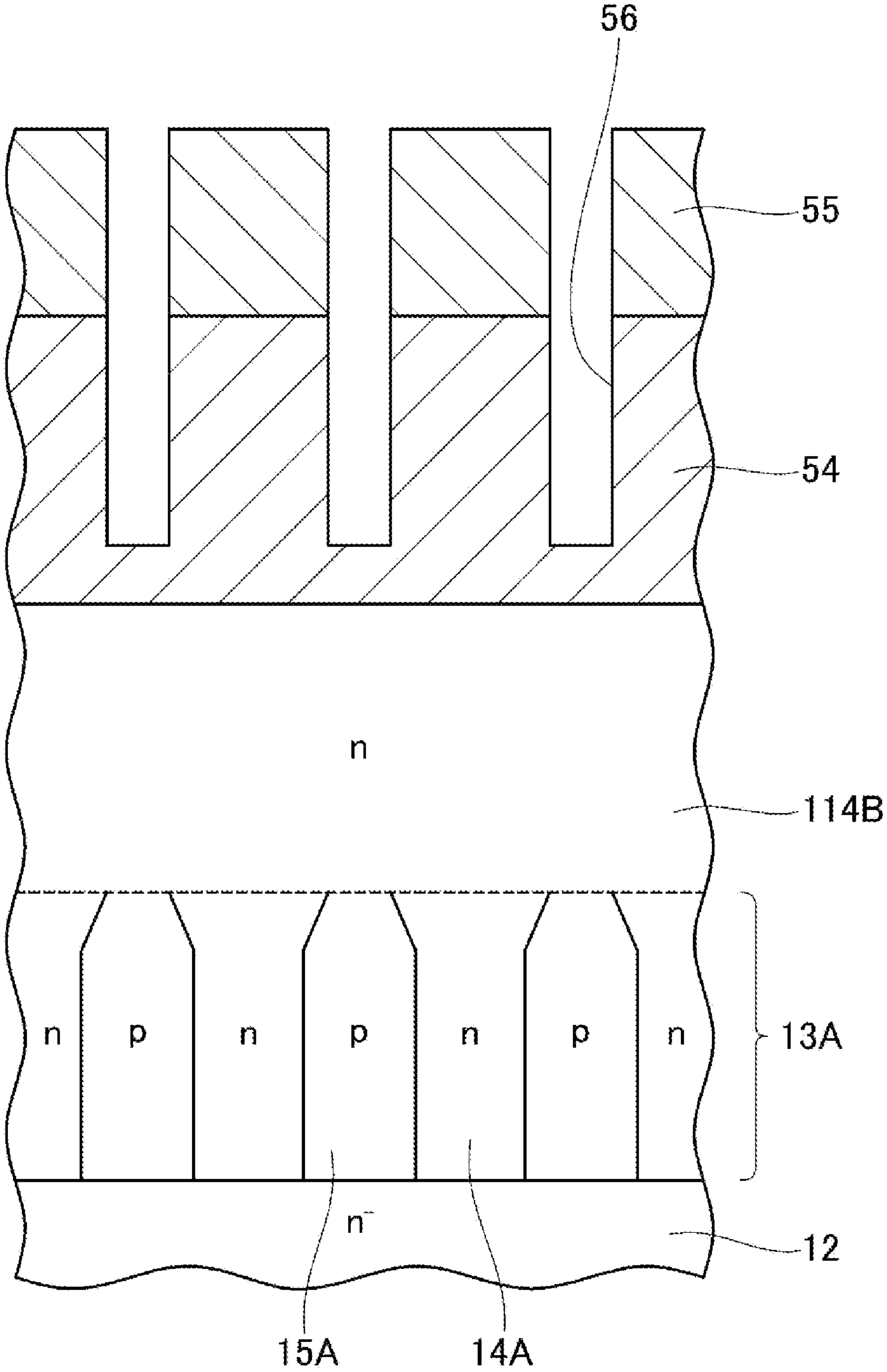
FIG. 18 schematically shows an enlarged sectional view of the repeating layer in the embodiment in a process of the first manufacturing method.

Next, as shown in FIG. 18, after the photoresist film 55 is patterned, an opening 56 is formed in the mask film 54 by using a dry etching technique. However, at this stage, the mask film 54 remains on the bottom surface of the opening 56.

Figure 19:
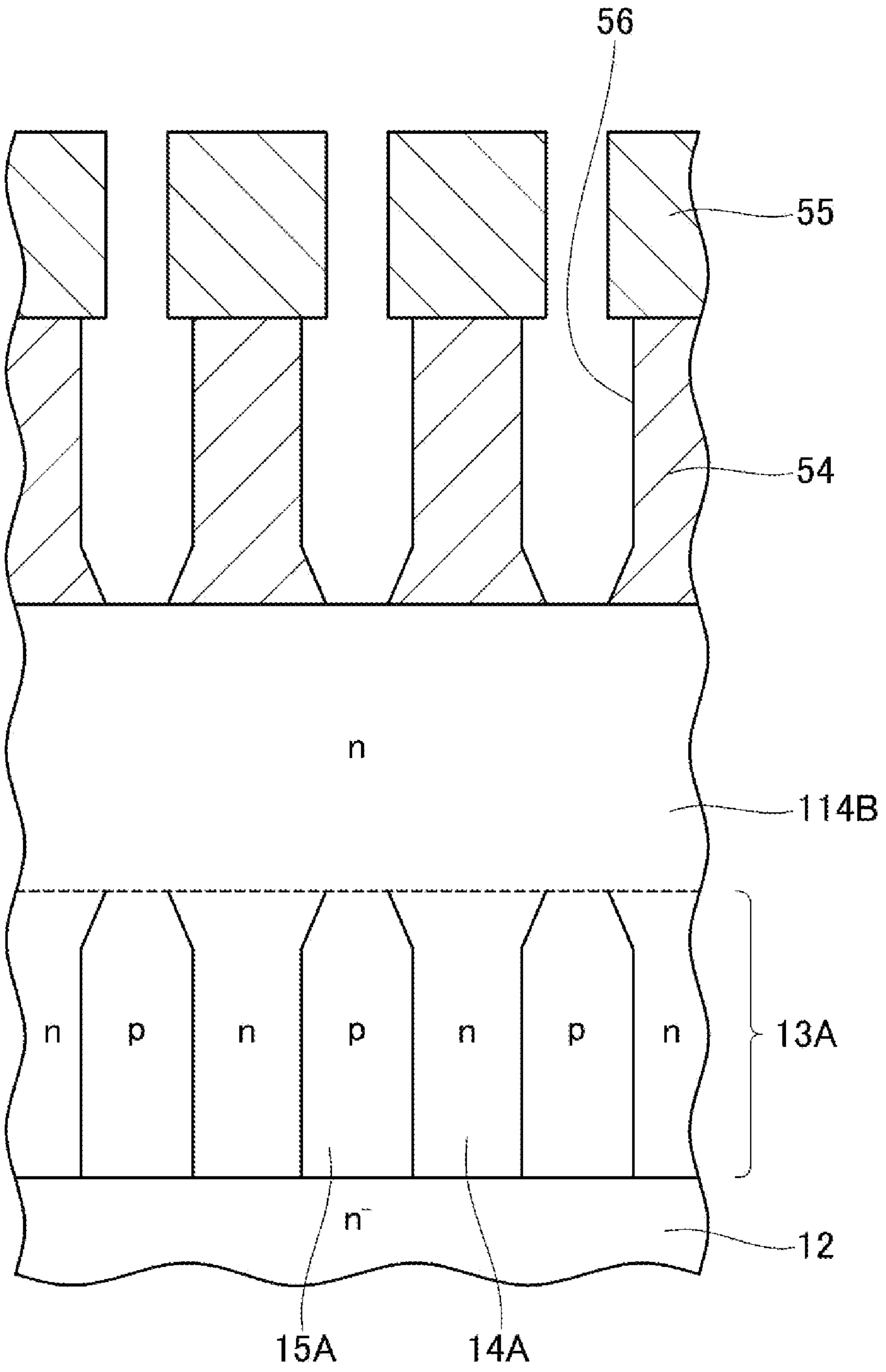
FIG. 19 schematically shows an enlarged sectional view of the repeating layer in the embodiment in a process of the first manufacturing method.

Next, as shown in FIG. 19, the opening 56 of the mask film 54 is enlarged using a wet etching technique so that the upper surface of the n-type upper epitaxial layer 114B is exposed from the bottom surface of the opening 56. In this step, the sidewall defining the bottom of the opening 56 of the mask film 54 may be formed to be rounded due to isotropic etching.

Figure 20:
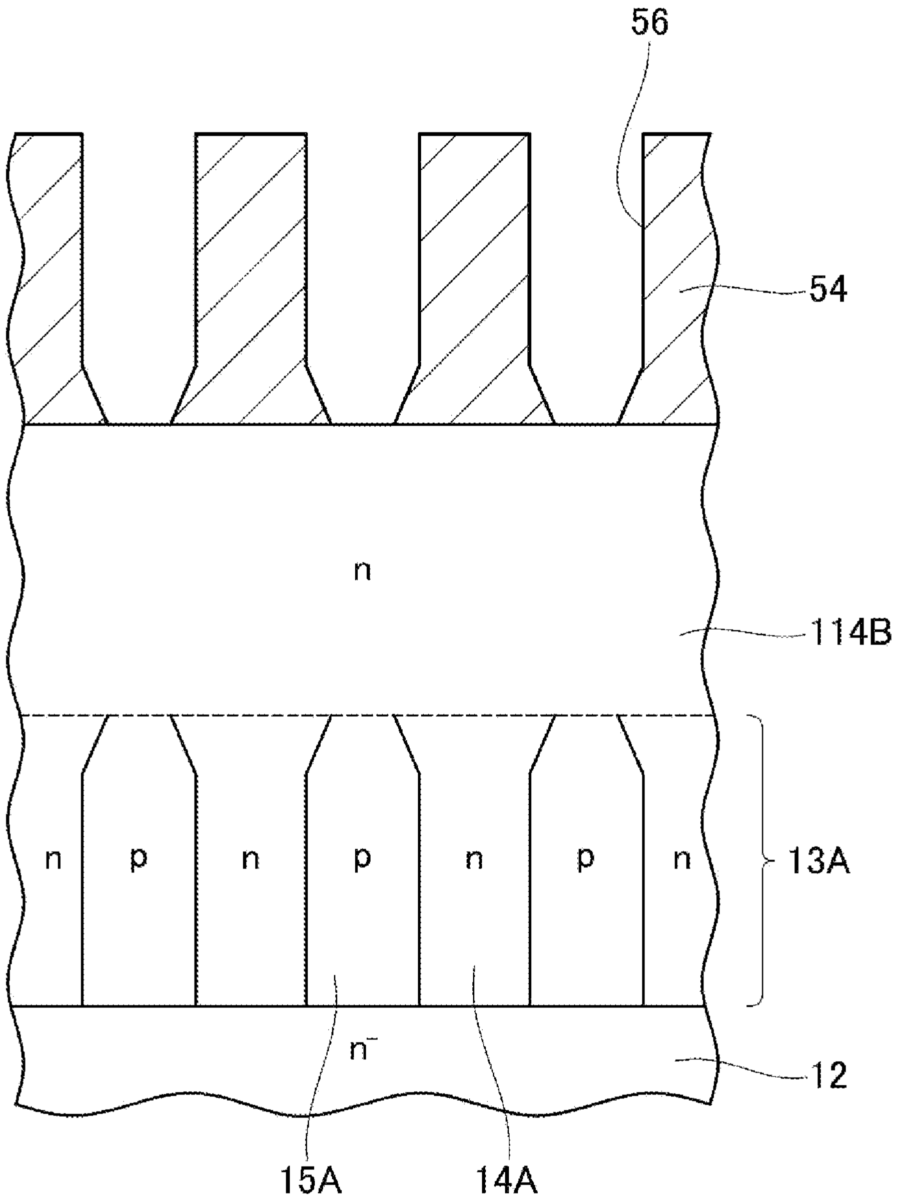
FIG. 20 schematically shows an enlarged sectional view of the repeating layer in the embodiment in a process of the first manufacturing method.

Next, as shown in FIG. 20, the photoresist film 55 is removed.

Figure 21:
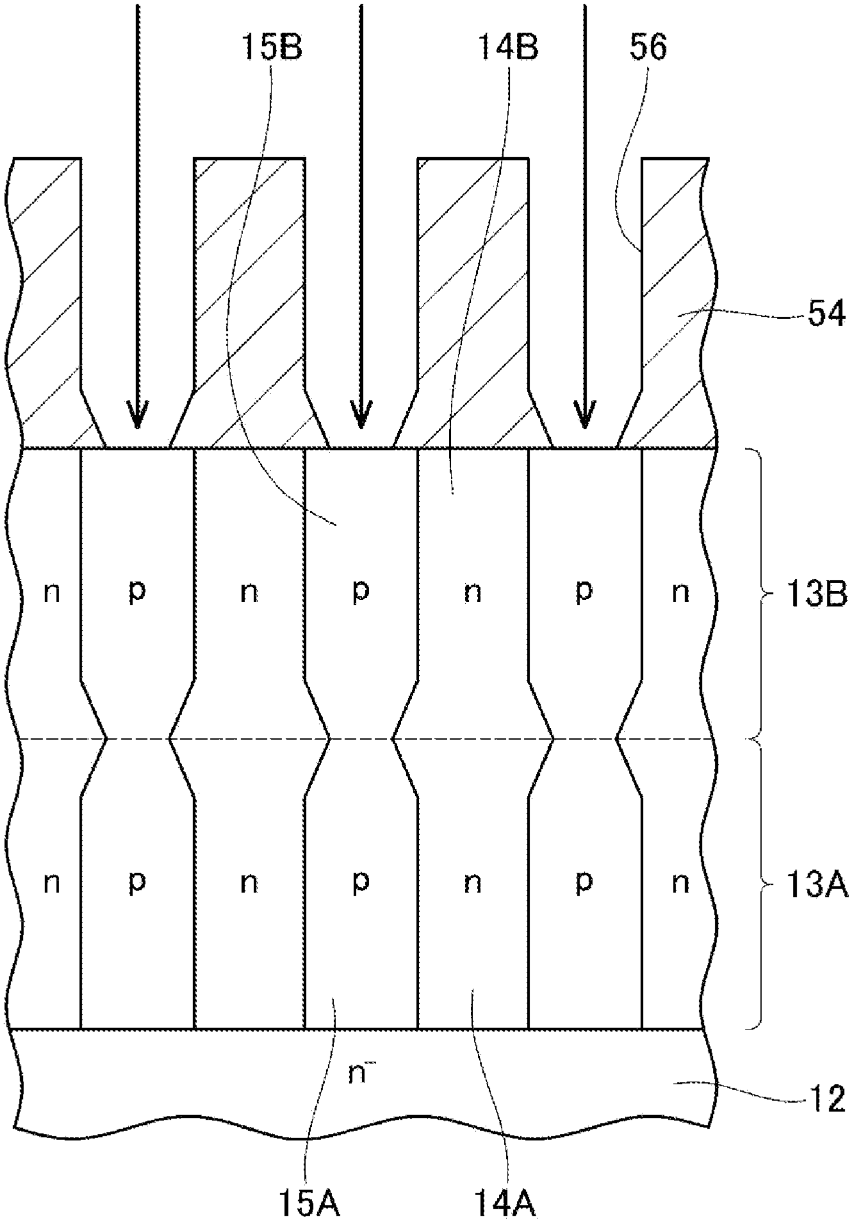
FIG. 21 schematically shows an enlarged sectional view of the repeating layer in the embodiment in a process of the first manufacturing method.

Next, as shown in FIG. 21, p-type ions are implanted into the n-type upper epitaxial layer 114B through the opening 56 of the mask film 54 by using an ion implantation technique. The ion implantation angle is set as a direction perpendicular to the upper surface of the n-type upper epitaxial layer 114B. In the n-type upper epitaxial layer 114B, p-type ions are implanted corresponding to the shape of the opening 56 of the mask film 54, and the upper portions 15B are formed. In addition, the upper portions 14B are formed in the remaining portion of the n-type upper epitaxial layer 114B after the upper portions 15B are formed. As a result, the upper layer 13B including the upper portions 15B and the upper portions 14B is formed. Through these steps, the repeating layer 13 in which the lower layer 13A and the upper layer 13B are stacked can be formed.

(Second Manufacturing Method)

The second manufacturing method is to form the repeating layer 13 shown in FIG. 7. The steps until the mask film is patterned on the n-type lower epitaxial layer 114A can be the same as the steps (see FIG. 11 and FIG. 12) of the first manufacturing method. Here, in the second manufacturing method, the mask film to be patterned on the n-type lower epitaxial layer 114A is denoted by "61", and the opening is denoted by "62".

Figure 22:
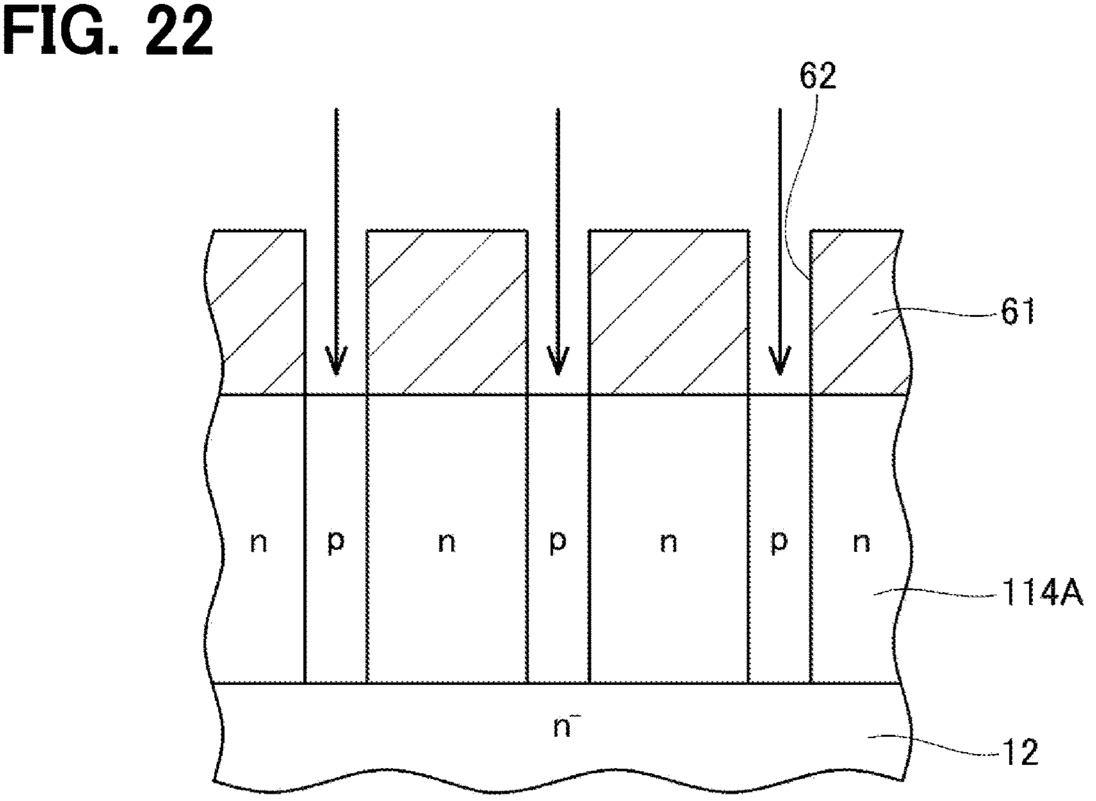
FIG. 22 schematically shows an enlarged sectional view of the repeating layer in the embodiment in a process of a second manufacturing method.

Next, as shown in FIG. 22, p-type ions are implanted into the n-type lower epitaxial layer 114A through the opening 62 of the mask film 61 by using an ion implantation technique. The ion implantation angle is set as a direction perpendicular to the upper surface of the n-type lower epitaxial layer 114A.

Figure 23:
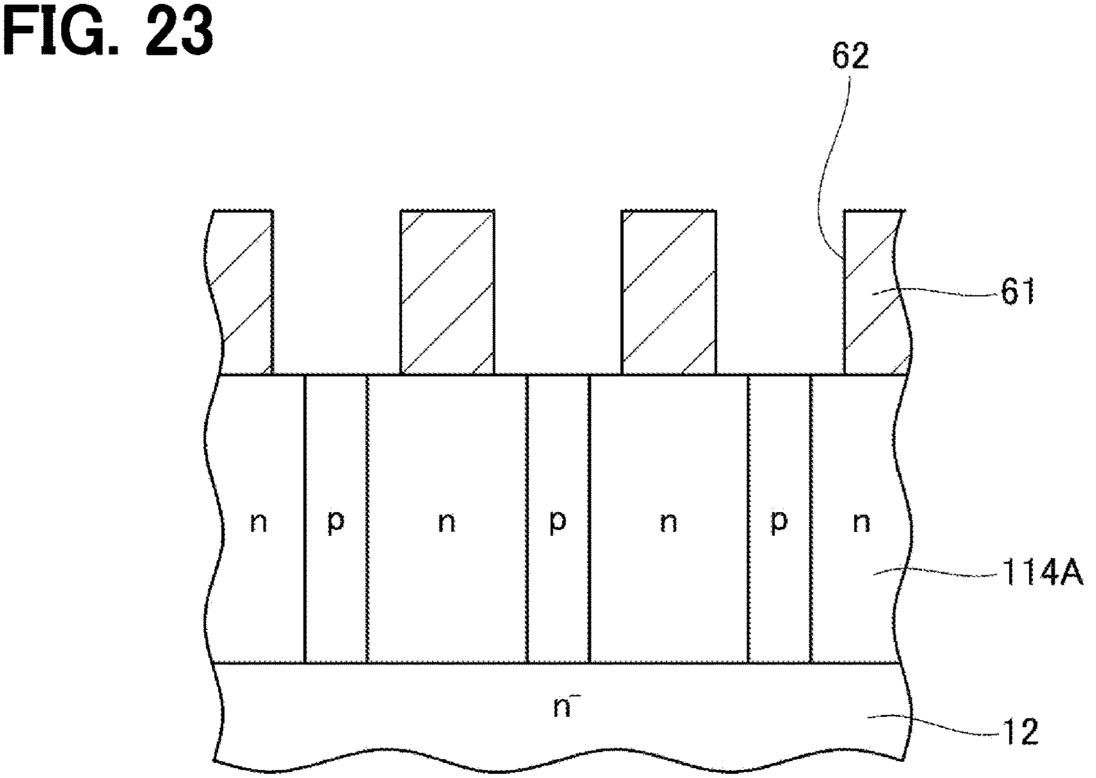
FIG. 23 schematically shows an enlarged sectional view of the repeating layer in the embodiment in a process of the second manufacturing method.

Next, as shown in FIG. 23, the side surface defining the opening 62 of the mask film 61 is etched using a wet etching technique to enlarge the opening 62 of the mask film 61.

Figure 24:
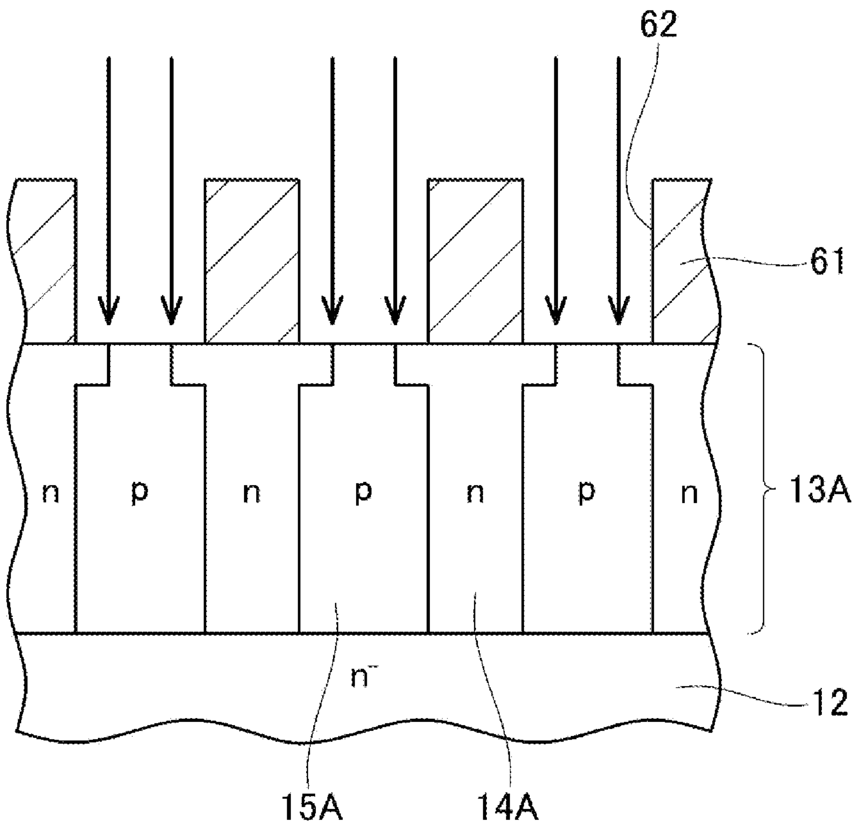
FIG. 24 schematically shows an enlarged sectional view of the repeating layer in the embodiment in a process of the second manufacturing method.

Next, as shown in FIG. 24, p-type ions are implanted into the n-type lower epitaxial layer 114A through the opening 62 of the mask film 61 by using an ion implantation technique. The ion implantation angle is set as a direction perpendicular to the upper surface of the n-type lower epitaxial layer 114A. Further, by adjusting the ion implantation energy, p-type ions are selectively implanted into the n-type lower epitaxial layer 114A in an area excluding the upper portion. In this manner, by performing ion implantation plural times under different ion implantation conditions, the lower portions 15A are formed in the n-type lower epitaxial layer 114A. The lower portions 14A are formed in the remaining portion of the n-type lower epitaxial layer 114A after the lower portions 15A are formed. As a result, the lower layer 13A including the lower portions 15A and the lower portions 14A is formed.

Figure 25:
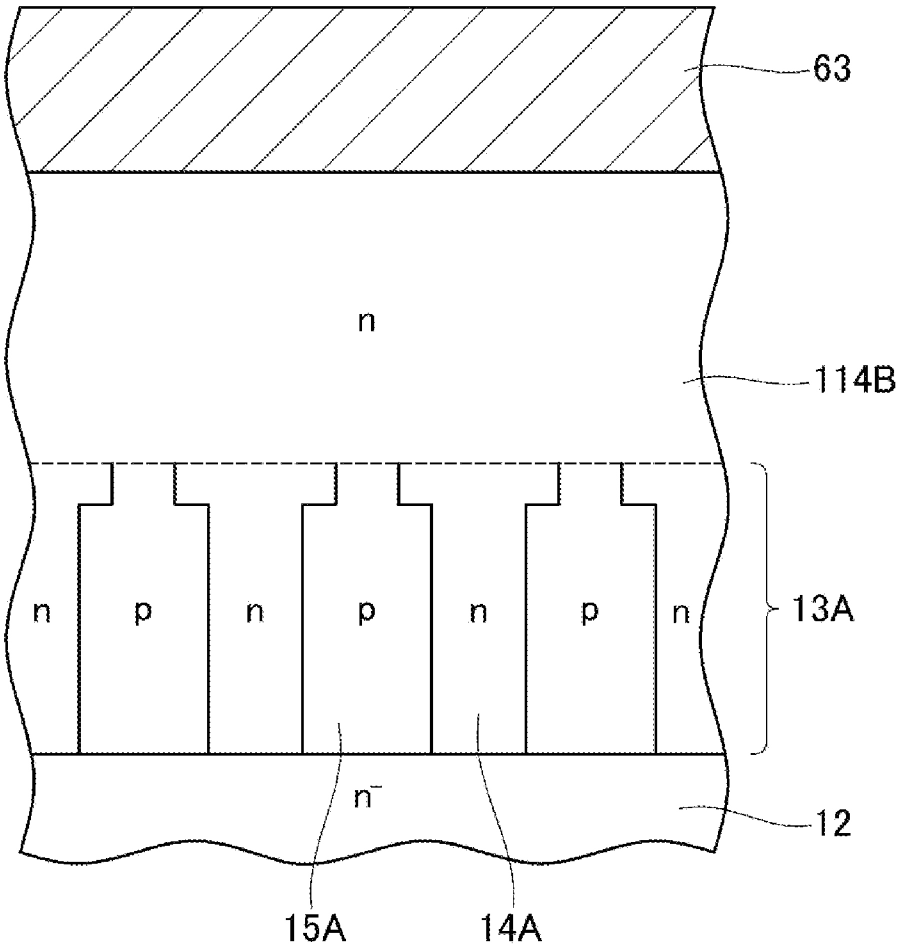
FIG. 25 schematically shows an enlarged sectional view of the repeating layer in the embodiment in a process of the second manufacturing method.

Next, as shown in FIG. 25, after the mask film 61 is removed, an n-type upper epitaxial layer 114B is formed on the lower layer 13A by using an epitaxial growth technique. As described above, in this step, the amount of positional deviation of the alignment mark may increase. Next, a mask film 63 is formed over the n-type upper epitaxial layer 114B.

Figure 26:
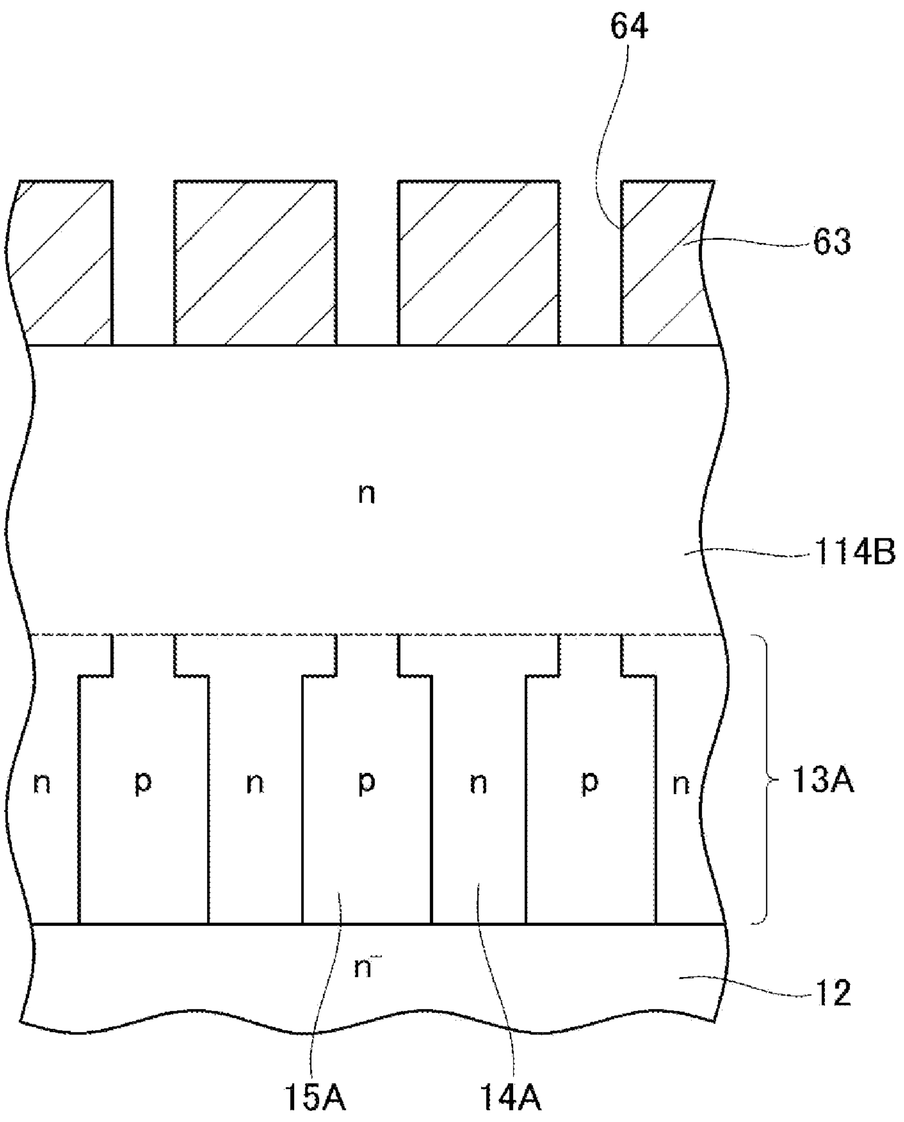
FIG. 26 schematically shows an enlarged sectional view of the repeating layer in the embodiment in a process of the second manufacturing method.

Next, as shown in FIG. 26, an opening 64 is formed in the mask film 63 by using a dry etching technique. The upper surface of the n-type upper epitaxial layer 114B is exposed from the bottom surface of the opening 64.

Figure 27:
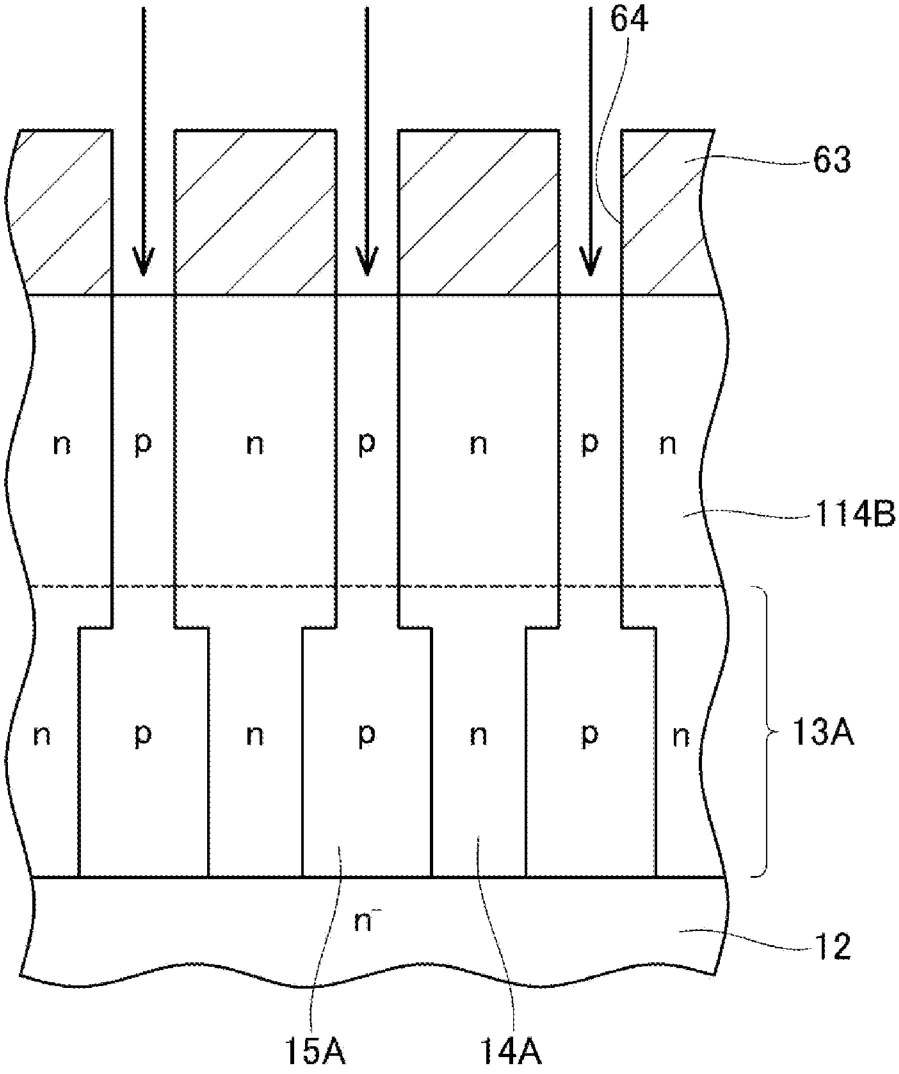
FIG. 27 schematically shows an enlarged sectional view of the repeating layer in the embodiment in a process of the second manufacturing method.

Next, as shown in FIG. 27, p-type ions are implanted into the n-type upper epitaxial layer 114B through the opening 64 of the mask film 63 by using an ion implantation technique. The ion implantation angle is set as a direction perpendicular to the upper surface of the n-type upper epitaxial layer 114B.

Figure 28:
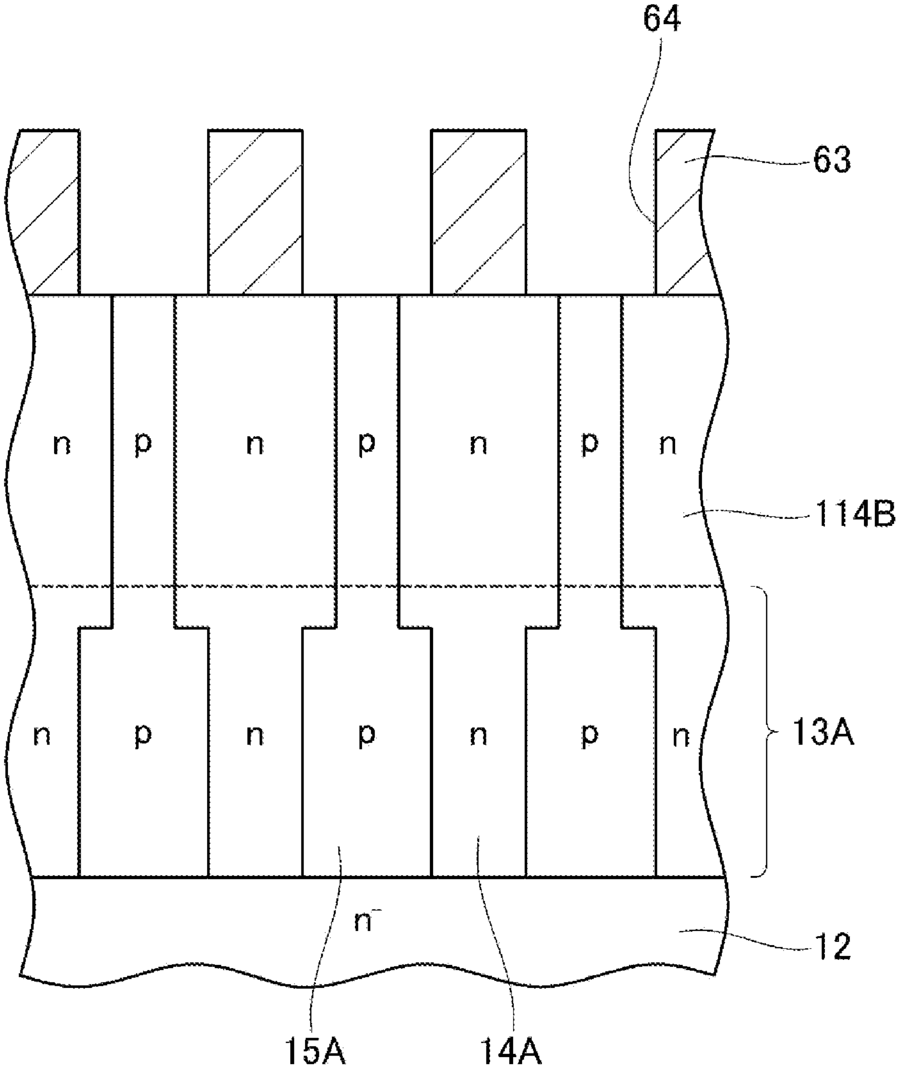
FIG. 28 schematically shows an enlarged sectional view of the repeating layer in the embodiment in a process of the second manufacturing method.

Next, as shown in FIG. 28, the side surface defining the opening 64 of the mask film 63 is etched using a wet etching technique to enlarge the opening 64 of the mask film 63.

Figure 29:
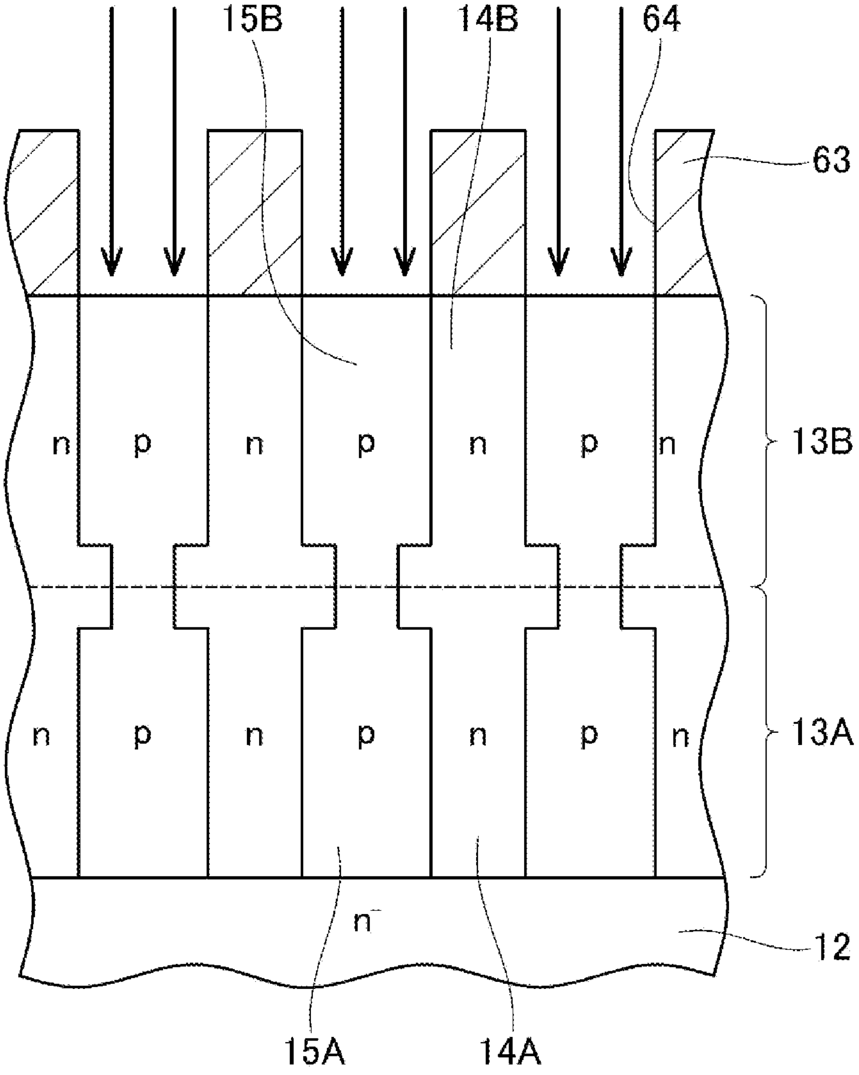
FIG. 29 schematically shows an enlarged sectional view of the repeating layer in the embodiment in a process of the second manufacturing method.

Next, as shown in FIG. 29, p-type ions are implanted into the n-type upper epitaxial layer 114B through the opening 64 of the mask film 63 by using an ion implantation technique. The ion implantation angle is set as a direction perpendicular to the upper surface of the n-type upper epitaxial layer 114B. Further, by adjusting the ion implantation energy, p-type ions are selectively implanted into the n-type upper epitaxial layer 114B in an area excluding the lower portion. In this manner, by performing ion implantation plural times under different ion implantation conditions, the upper portions 15B are formed in the n-type upper epitaxial layer 114B. In addition, the upper portions 14B are formed in the remaining portion of the n-type upper epitaxial layer 114B after the upper portions 15B are formed. As a result, the upper layer 13B including the upper portions 15B and the upper portions 14B is formed. Through these steps, the repeating layer 13 in which the lower layer 13A and the upper layer 13B are stacked can be formed.

(Third Manufacturing Method)

Figure 30:
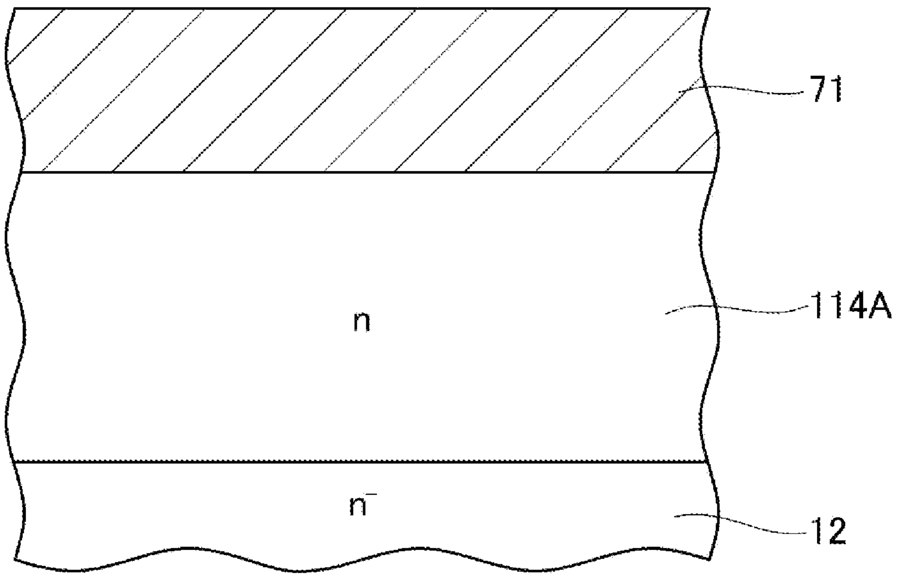
FIG. 30 schematically shows an enlarged sectional view of the repeating layer in the embodiment in a process of a third manufacturing method.

The third manufacturing method is to form the repeating layer 13 shown in FIG. 7. First, as shown in FIG. 30, an n-type lower epitaxial layer 114A is formed on the drift region 12. Next, a mask film 71 is formed on the n-type lower epitaxial layer 114A.

Figure 31:
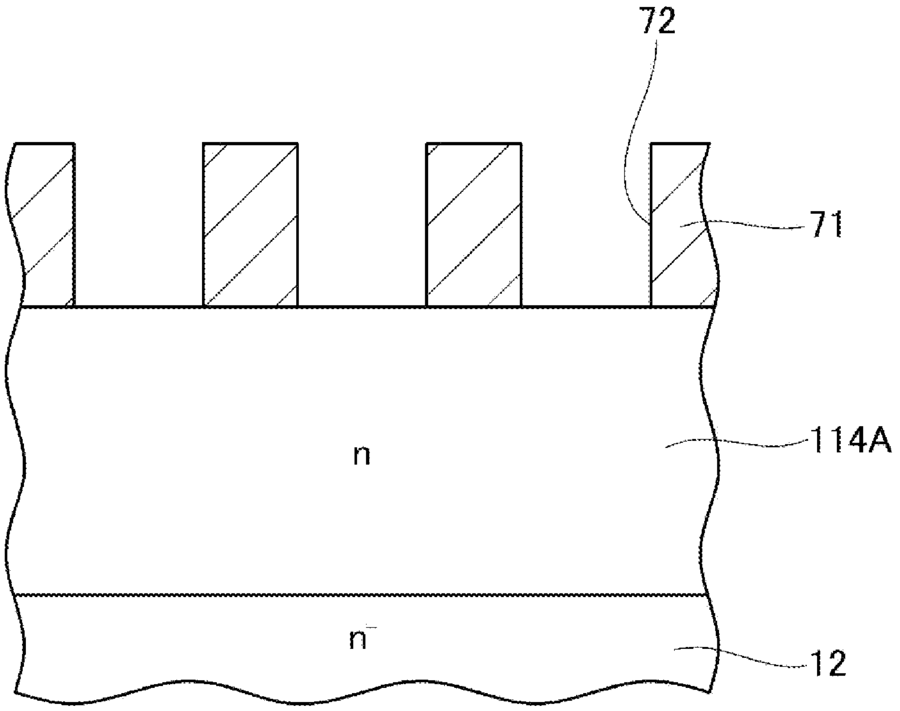
FIG. 31 schematically shows an enlarged sectional view of the repeating layer in the embodiment in a process of the third manufacturing method.

Next, as shown in FIG. 31, an opening 72 is formed in the mask film 71 by using a dry etching technique. The upper surface of the n-type lower epitaxial layer 114A is exposed from the bottom surface of the opening 72.

Figure 32:
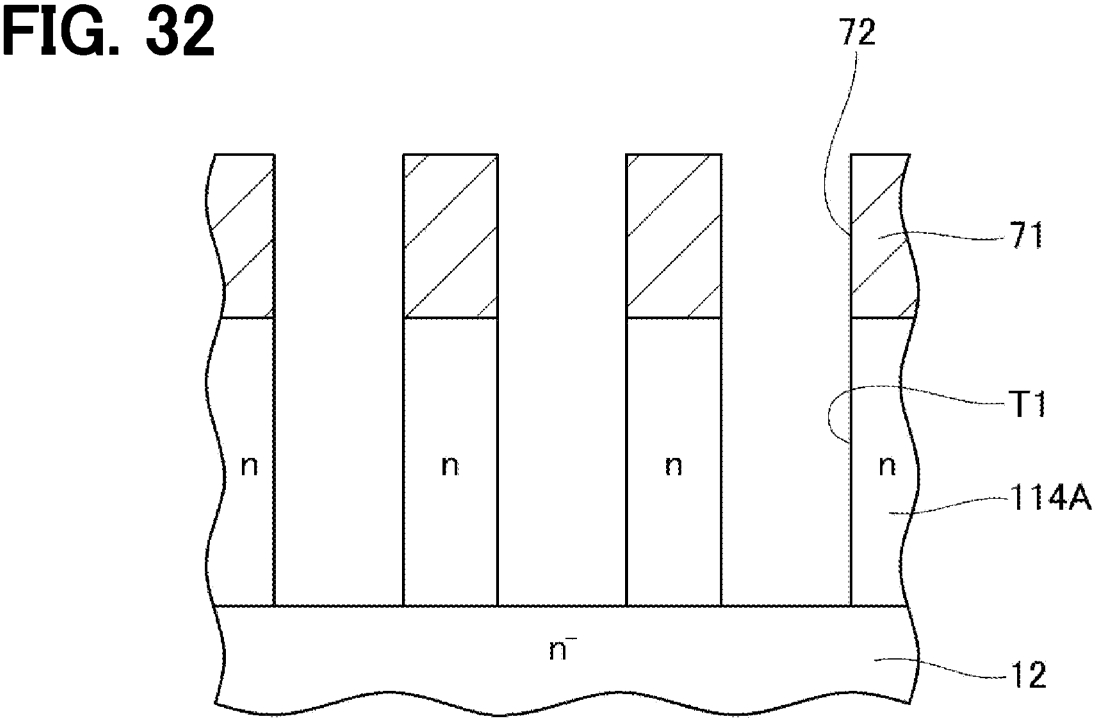
FIG. 32 schematically shows an enlarged sectional view of the repeating layer in the embodiment in a process of the third manufacturing method.

Next, as shown in FIG. 32, a trench T1 is formed in the n-type lower epitaxial layer 114A by using a dry etching technique.

Figure 33:
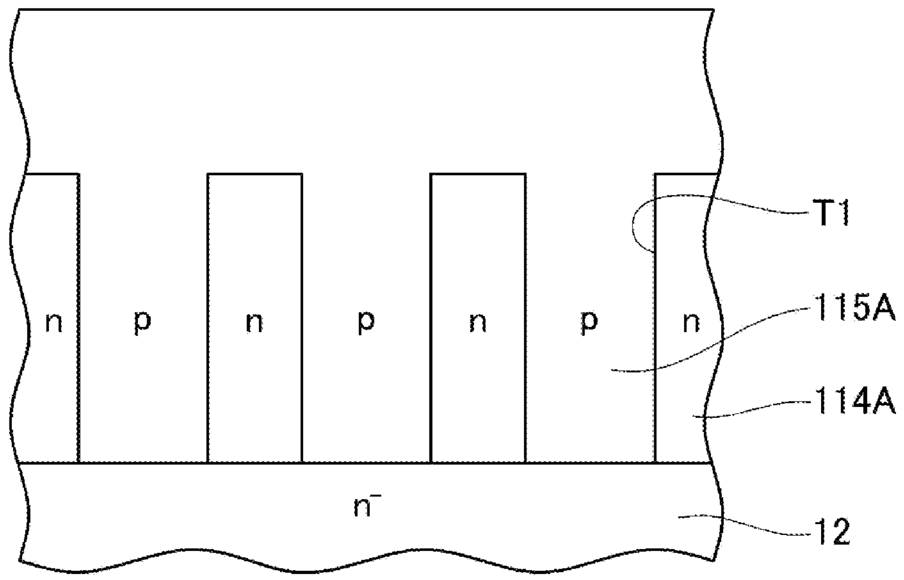
FIG. 33 schematically shows an enlarged sectional view of the repeating layer in the embodiment in a process of the third manufacturing method.

Next, as shown in FIG. 33, a p-type epitaxial layer 115A is formed so that the trench T1 is filled with the epitaxial growth technique.

Figure 34:
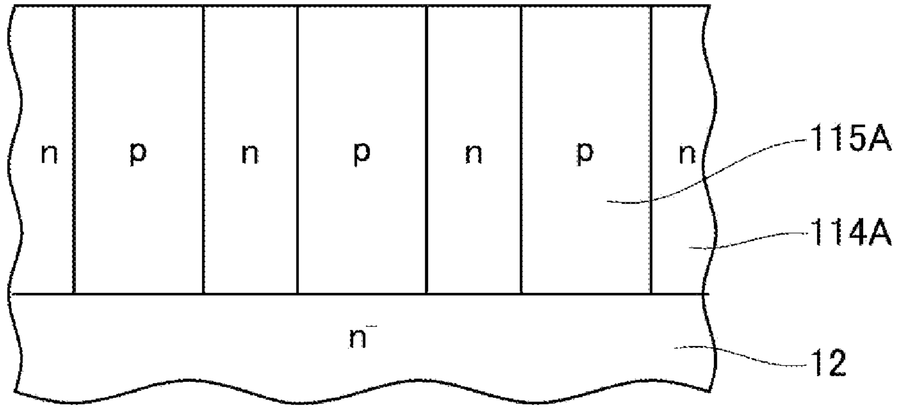
FIG. 34 schematically shows an enlarged sectional view of the repeating layer in the embodiment in a process of the third manufacturing method.

Next, as shown in FIG. 34, the p-type epitaxial layer 115A formed on the n-type lower epitaxial layer 114A is removed using a polishing technique to expose the upper surface of the n-type lower epitaxial layer 114A.

Figure 35:
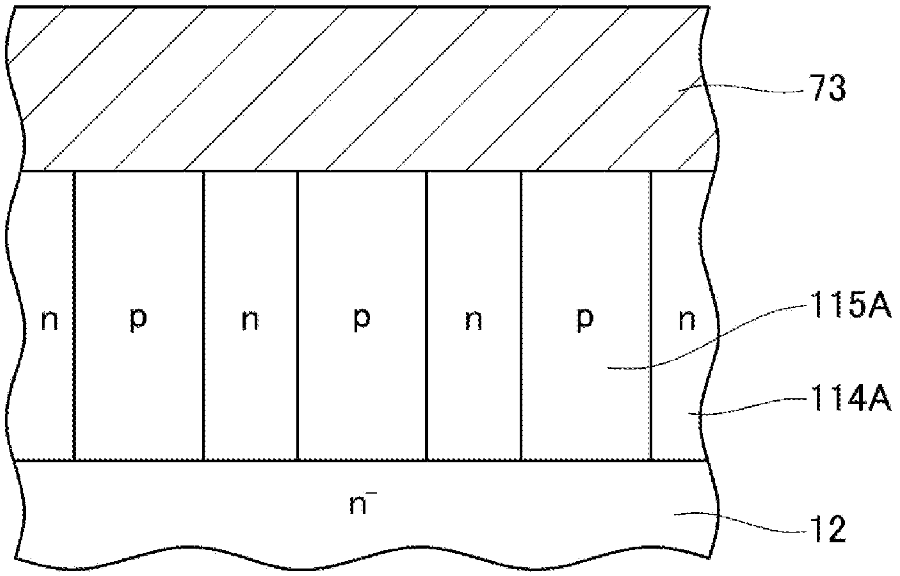
FIG. 35 schematically shows an enlarged sectional view of the repeating layer in the embodiment in a process of the third manufacturing method.

Next, as shown in FIG. 35, a mask film 73 is formed on the n-type lower epitaxial layer 114A and the p-type epitaxial layer 115A.

Figure 36:
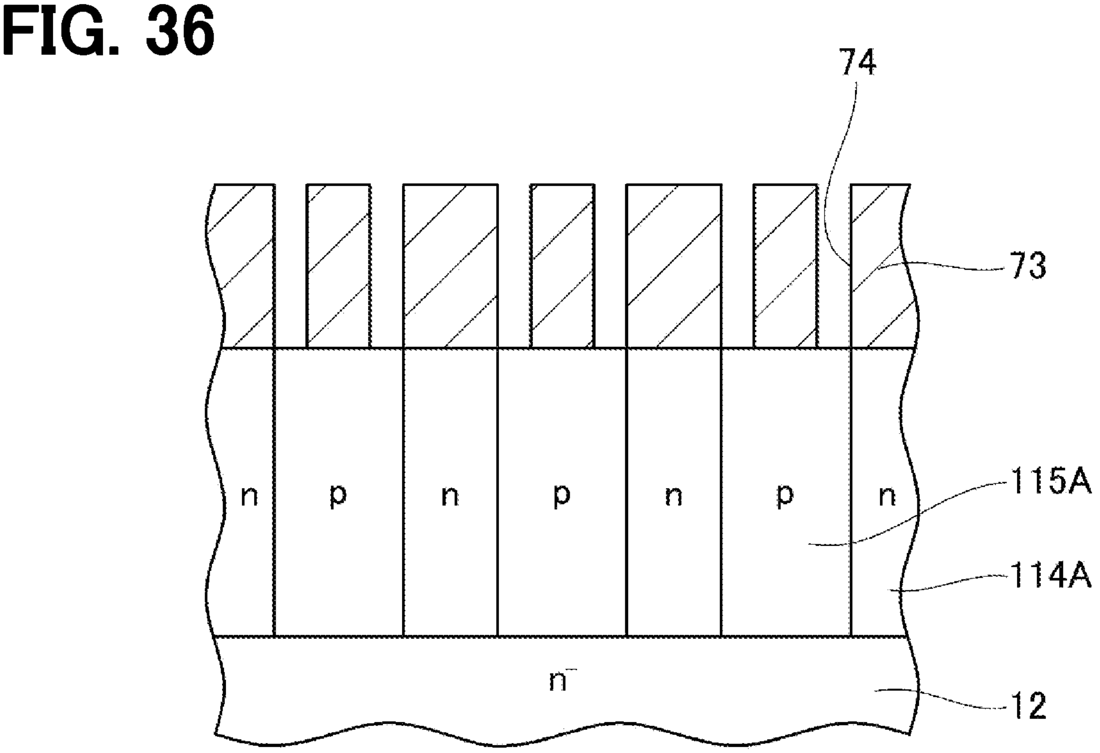
FIG. 36 schematically shows an enlarged sectional view of the repeating layer in the embodiment in a process of the third manufacturing method.

Next, as shown in FIG. 36, an opening 74 is formed in the mask film 73 by using a dry etching technique. A part of the upper surface of the p-type epitaxial layer 115A is exposed from the bottom surface of the opening 74.

Figure 37:
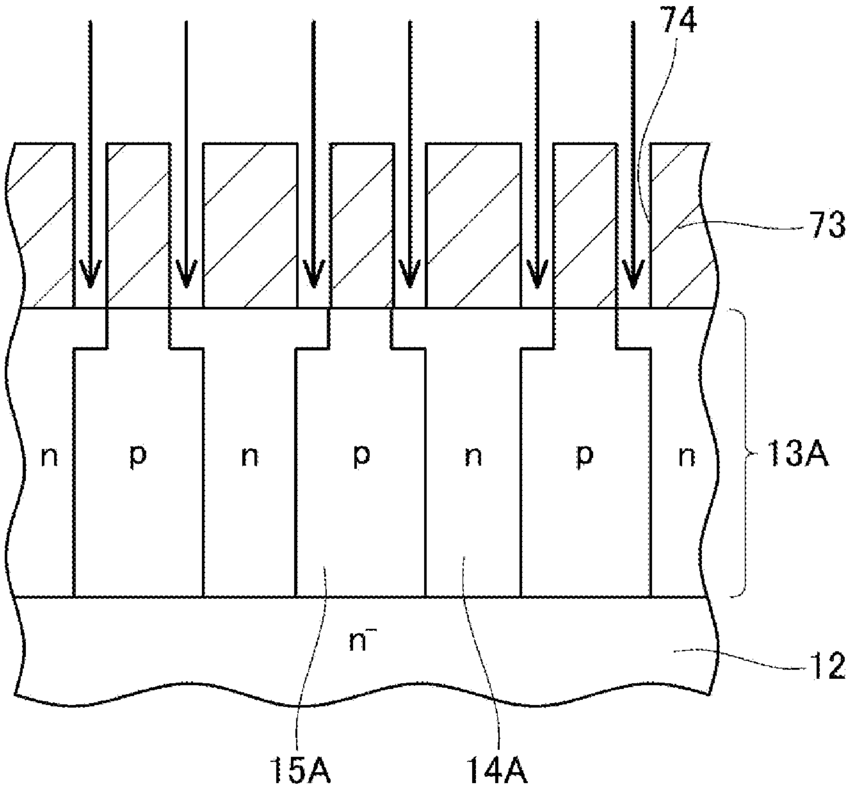
FIG. 37 schematically shows an enlarged sectional view of the repeating layer in the embodiment in a process of the third manufacturing method.

Next, as shown in FIG. 37, using an ion implantation technique, n-type ions are implanted into the p-type epitaxial layer 115A through the opening 74 of the mask film 73 by counter doping. The ion implantation angle is set as a direction perpendicular to the upper surface of the p-type epitaxial layer 115A. Further, by adjusting the ion implantation energy, n-type ions are selectively implanted into only the upper portion of the p-type epitaxial layer 115A. In this manner, the lower portions 15A are formed in the n-type lower epitaxial layer 114A by performing epitaxial growth and ion implantation in combination. In addition, the lower portions 14A are formed in the remaining portion of the n-type lower epitaxial layer 114A after the lower portions 15A are formed. As a result, the lower layer 13A including the lower portions 15A and the lower portions 14A is formed.

Figure 38:
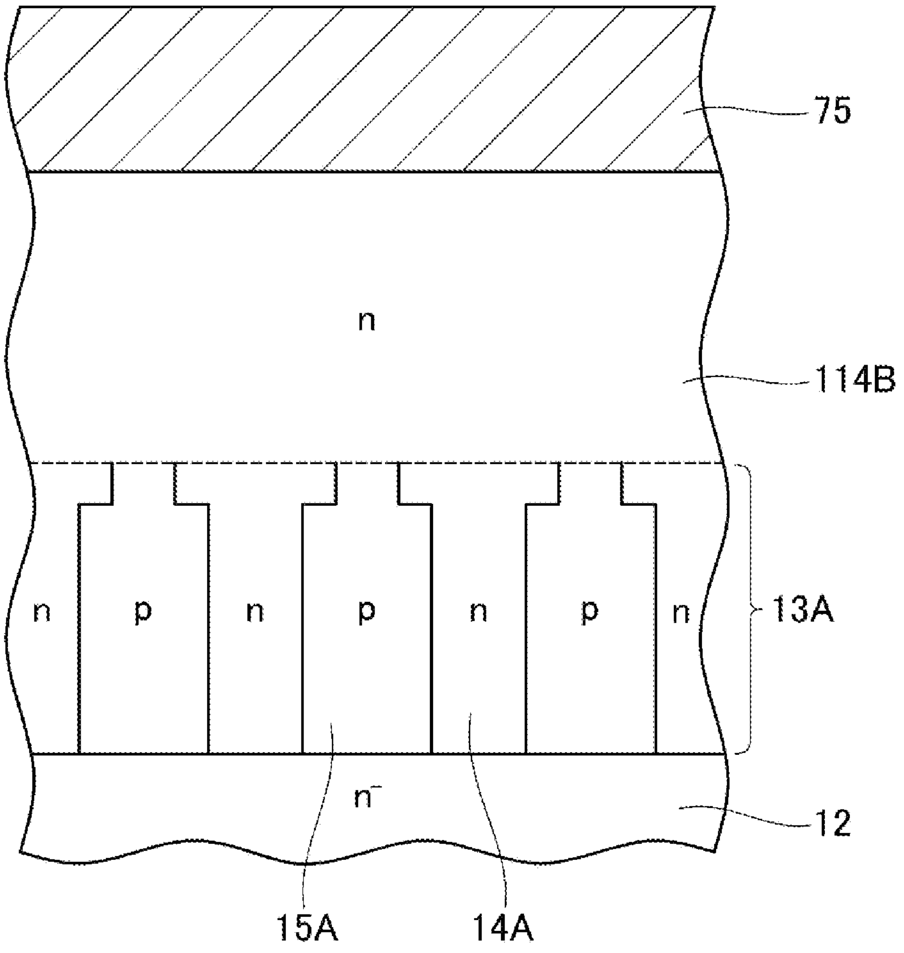
FIG. 38 schematically shows an enlarged sectional view of the repeating layer in the embodiment in a process of the third manufacturing method.

Next, as shown in FIG. 38, after the mask film 73 is removed, the n-type upper epitaxial layer 114B is formed on the lower layer 13A by using an epitaxial growth technique. As described above, in this step, the amount of positional deviation of the alignment mark may increase. Next, a mask film 75 is formed over the n-type upper epitaxial layer 114B.

Figure 39:
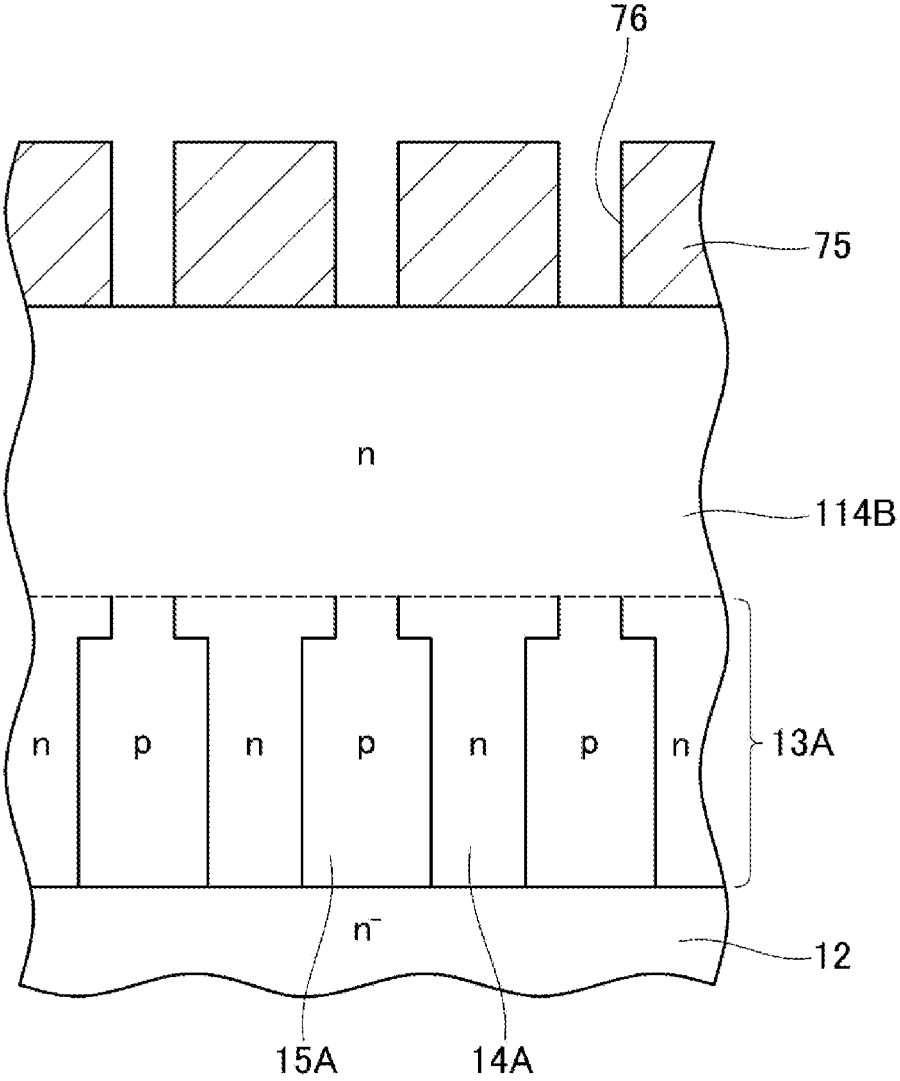
FIG. 39 schematically shows an enlarged sectional view of the repeating layer in the embodiment in a process of the third manufacturing method.

Next, as shown in FIG. 39, an opening 76 is formed in the mask film 75 by using a dry etching technique. The upper surface of the n-type upper epitaxial layer 114B is exposed from the bottom surface of the opening 76.

Figure 40:
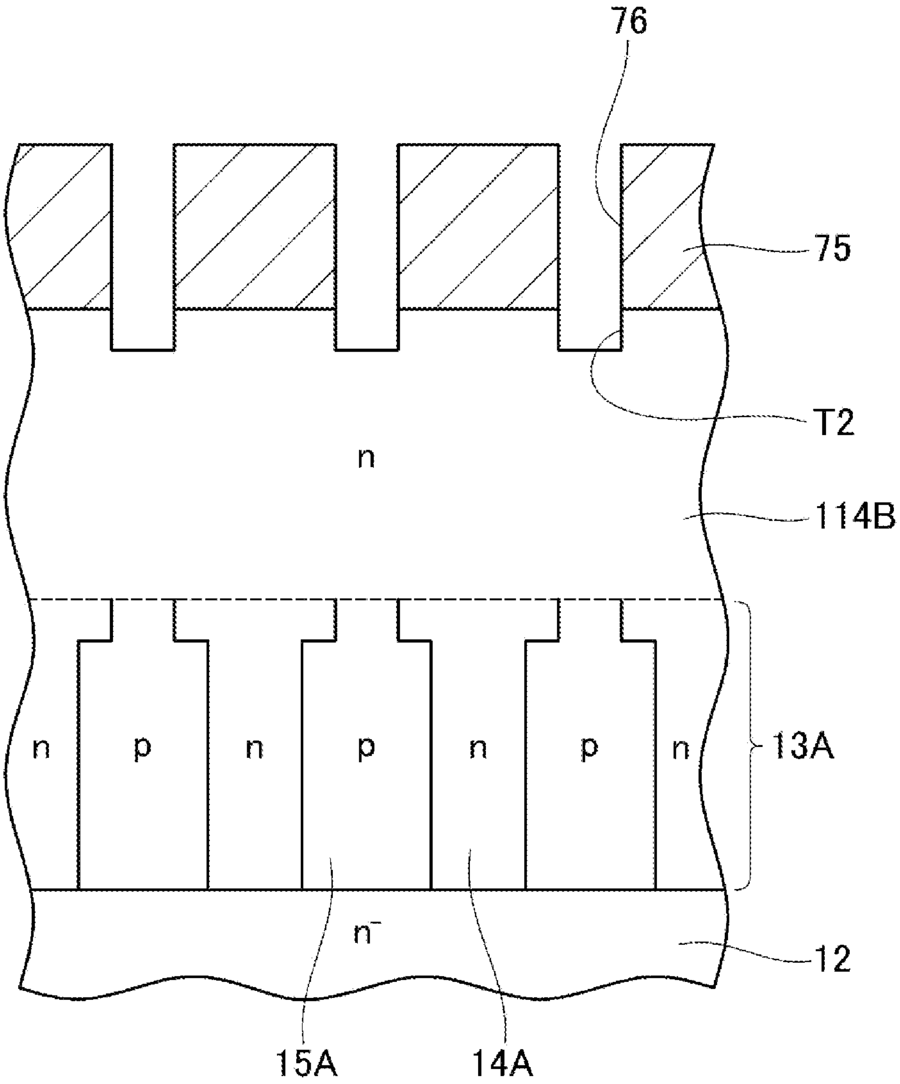
FIG. 40 schematically shows an enlarged sectional view of the repeating layer in the embodiment in a process of the third manufacturing method.

Next, as shown in FIG. 40, a trench T2 is formed in the n-type upper epitaxial layer 114B by using a dry etching technique. The trench T2 is formed shallowly in the upper portion of the n-type upper epitaxial layer 114B.

Figure 41:
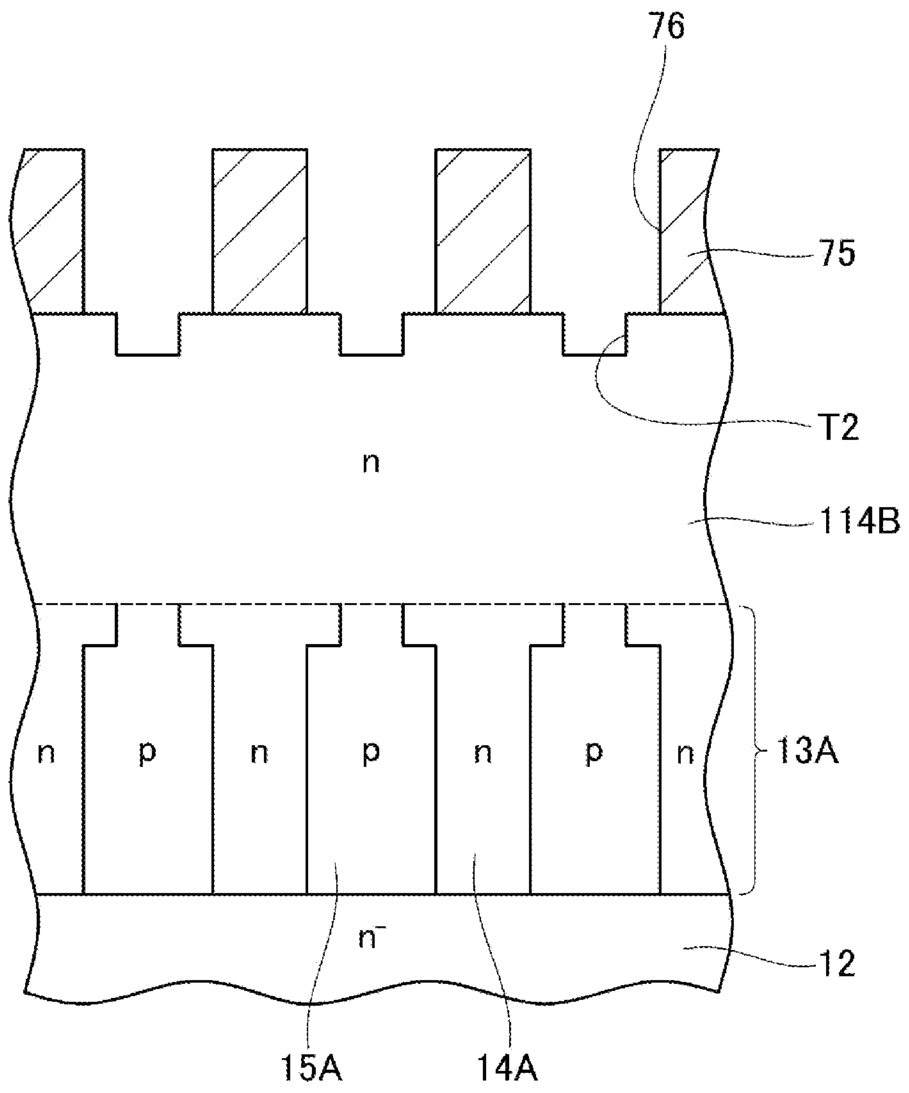
FIG. 41 schematically shows an enlarged sectional view of the repeating layer in the embodiment in a process of the third manufacturing method.

Next, as shown in FIG. 41, the side surface defining the opening 76 of the mask film 75 is etched using a wet etching technique to enlarge the opening 76 of the mask film 75.

Figure 42:
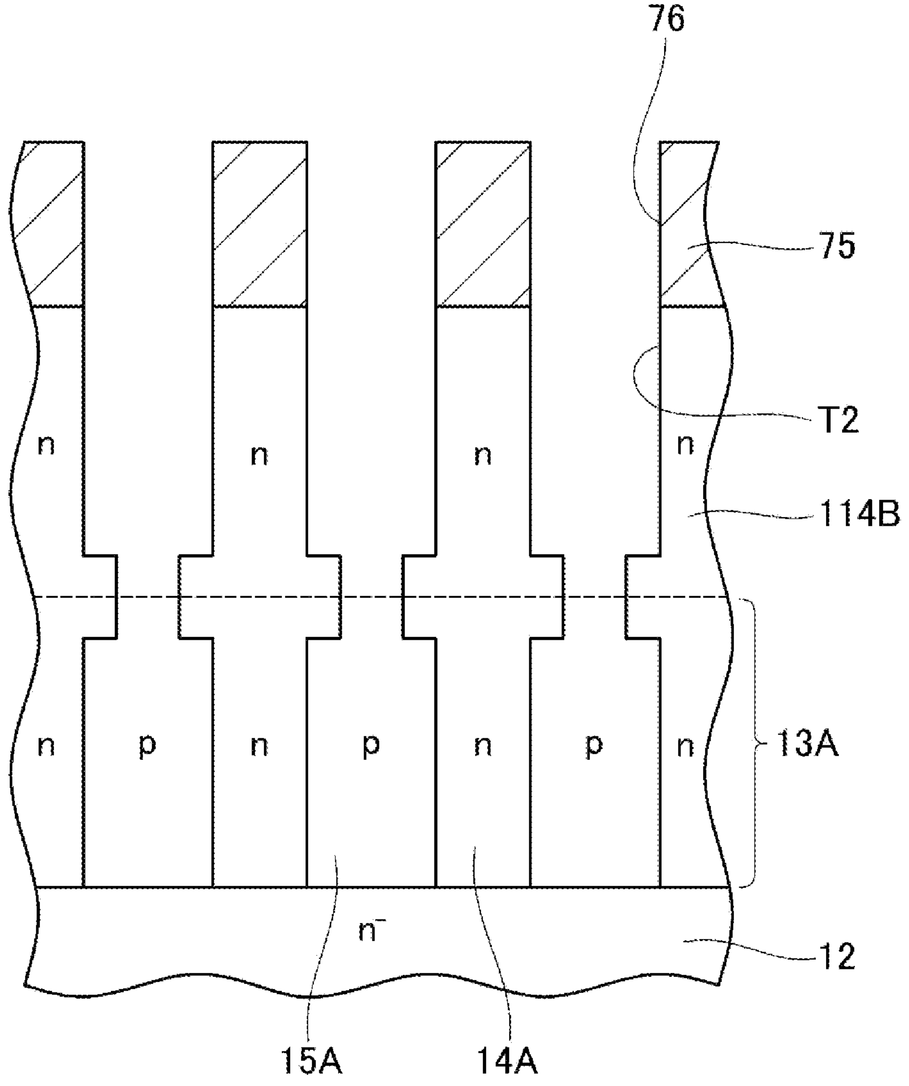
FIG. 42 schematically shows an enlarged sectional view of the repeating layer in the embodiment in a process of the third manufacturing method.

Next, as shown in FIG. 42, the trench T2 formed in the n-type upper epitaxial layer 114B is deeply processed using a dry etching technique. The trench T2 is deeply processed while the tip is maintained in a convex shape.

Figure 43:
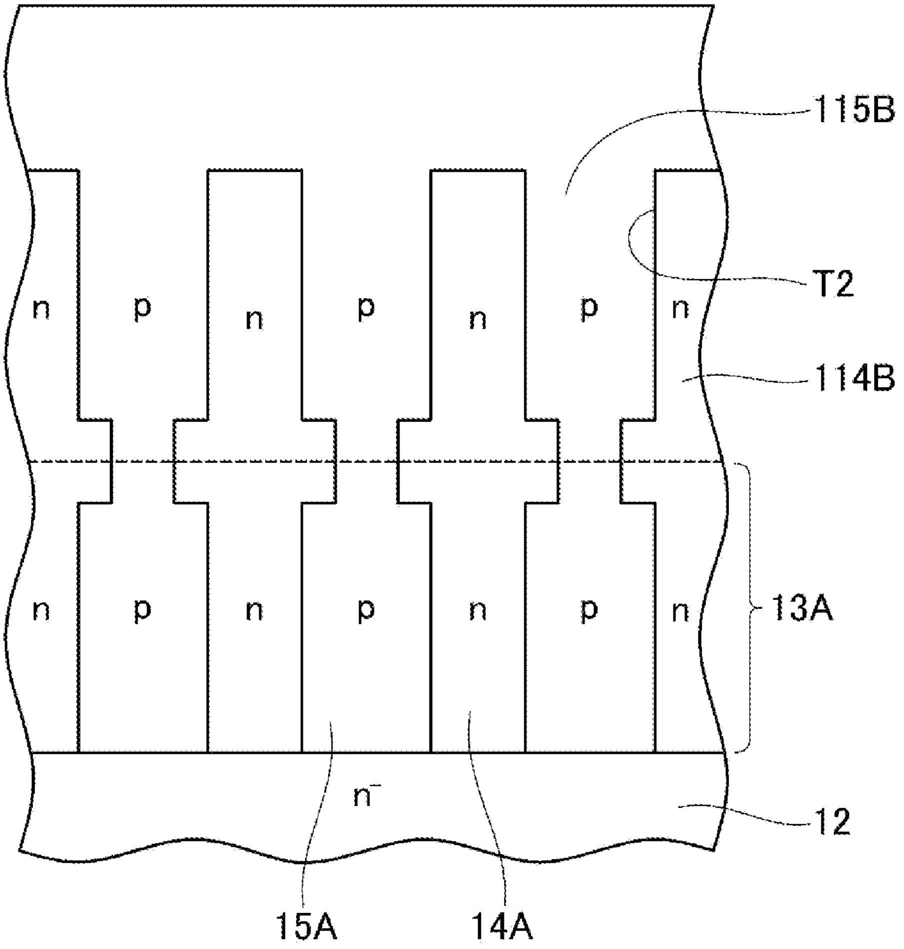
FIG. 43 schematically shows an enlarged sectional view of the repeating layer in the embodiment in a process of the third manufacturing method.

Next, as shown in FIG. 43, after the mask film 75 is removed, the p-type epitaxial layer 115B is formed so that the trench T2 is filled with the epitaxial growth technique.

Figure 44:
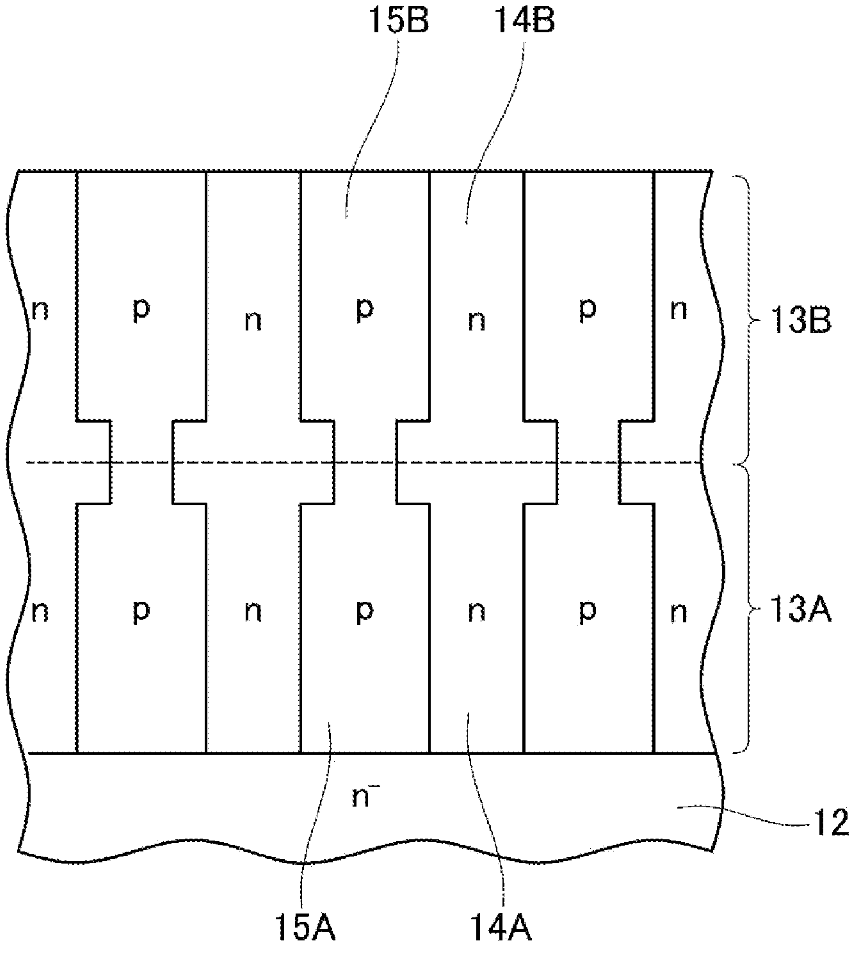
FIG. 44 schematically shows an enlarged sectional view of the repeating layer in the embodiment in a process of the third manufacturing method.

Next, as shown in FIG. 44, the p-type epitaxial layer 115B formed on the n-type upper epitaxial layer 114B is removed using a polishing technique to expose the upper surface of the n-type upper epitaxial layer 114B. In this manner, the upper portions 15B are formed in the n-type upper epitaxial layer 114B by performing trench processing and epitaxial growth plural times in combination. In addition, the upper portions 14B are formed in the remaining portion of the n-type upper epitaxial layer 114B after the upper portions 15B are formed. As a result, the upper layer 13B including the upper portions 15B and the upper portions 14B is formed. Through these steps, the repeating layer 13 in which the lower layer 13A and the upper layer 13B are stacked can be formed.

(Fourth Manufacturing Method)

The fourth manufacturing method is to form the repeating layer 13 shown in FIG. 9. The steps up to the oblique ion implantation into the n-type lower epitaxial layer 114A can be the same as the steps (FIG. 11, FIG. 12, and FIG. 13) of the first manufacturing method. Here, in the fourth manufacturing method, the mask film to be patterned on the n-type lower epitaxial layer 114A is denoted by "81", and the opening is denoted by "82".

Figure 45:
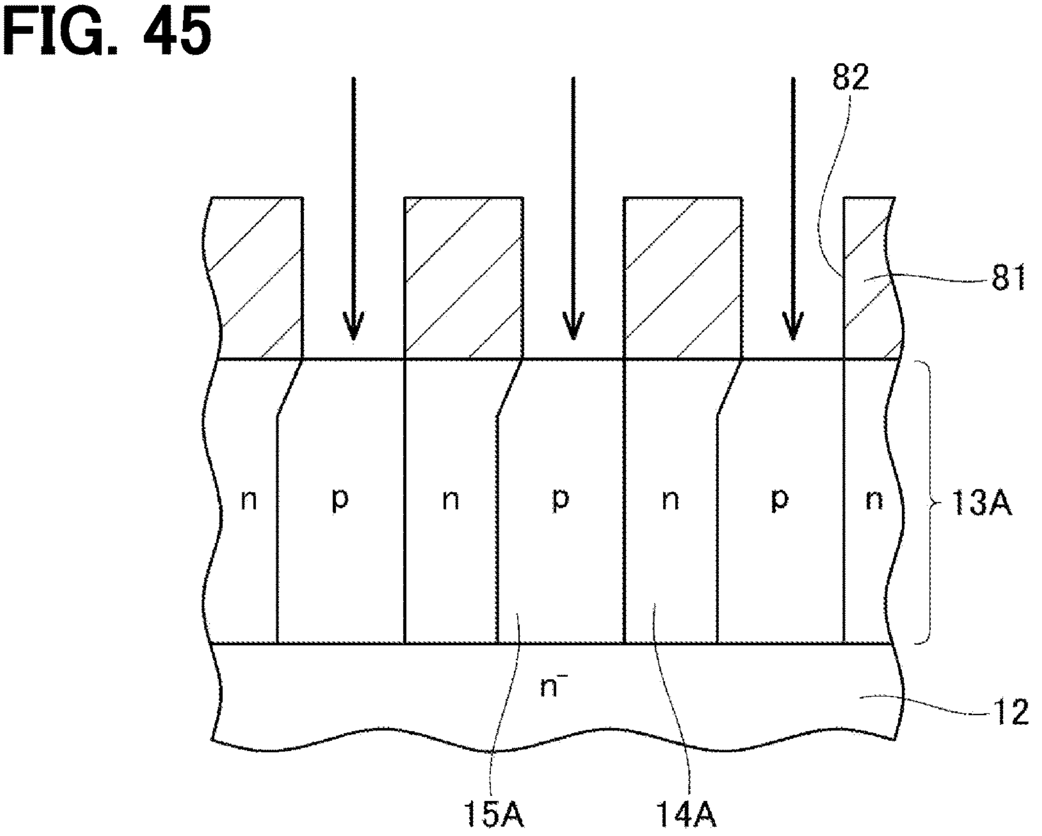
FIG. 45 schematically shows an enlarged sectional view of the repeating layer in the embodiment in a process of a fourth manufacturing method.

Next, as shown in FIG. 45, p-type ions are implanted into the n-type lower epitaxial layer 114A through the opening 82 of the mask film 81 by using an ion implantation technique. The ion implantation angle is set as a direction perpendicular to the upper surface of the n-type lower epitaxial layer 114A. In this manner, by performing ion implantation plural times under different ion implantation conditions, the lower portions 15A are formed in the n-type lower epitaxial layer 114A. The lower portions 14A are formed in the remaining portion of the n-type lower epitaxial layer 114A after the lower portions 15A are formed. As a result, the lower layer 13A including the lower portions 15A and the lower portions 14A is formed.

Figure 46:
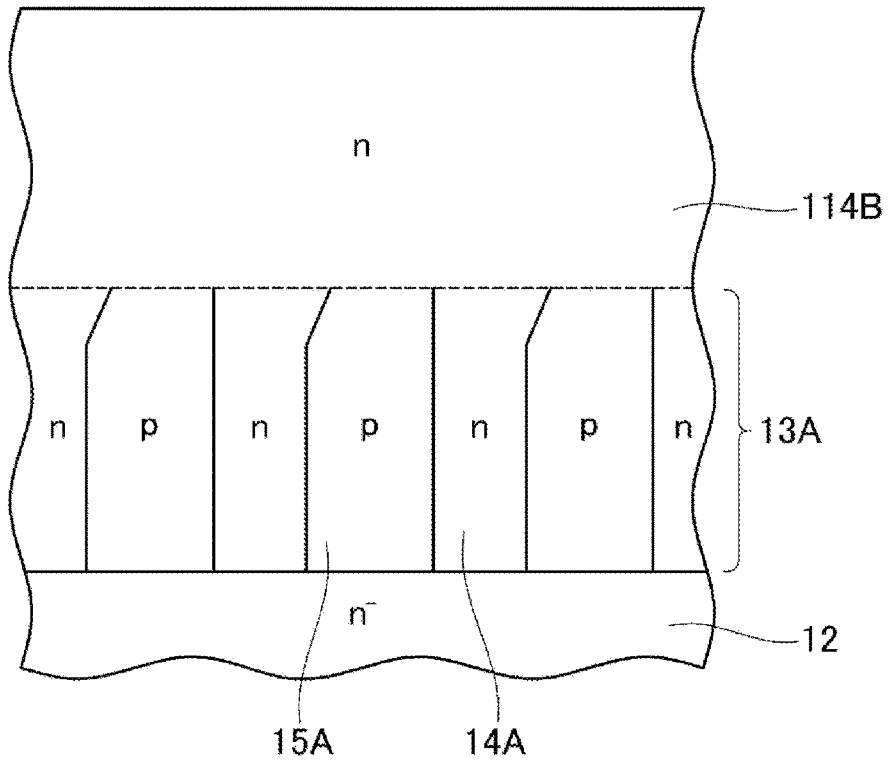
FIG. 46 schematically shows an enlarged sectional view of the repeating layer in the embodiment in a process of the fourth manufacturing method.

Next, as shown in FIG. 46, after the mask film 81 is removed, an n-type upper epitaxial layer 114B is formed on the lower layer 13A by using an epitaxial growth technique. As described above, in this step, the amount of positional deviation of the alignment mark may increase.

Figure 47:
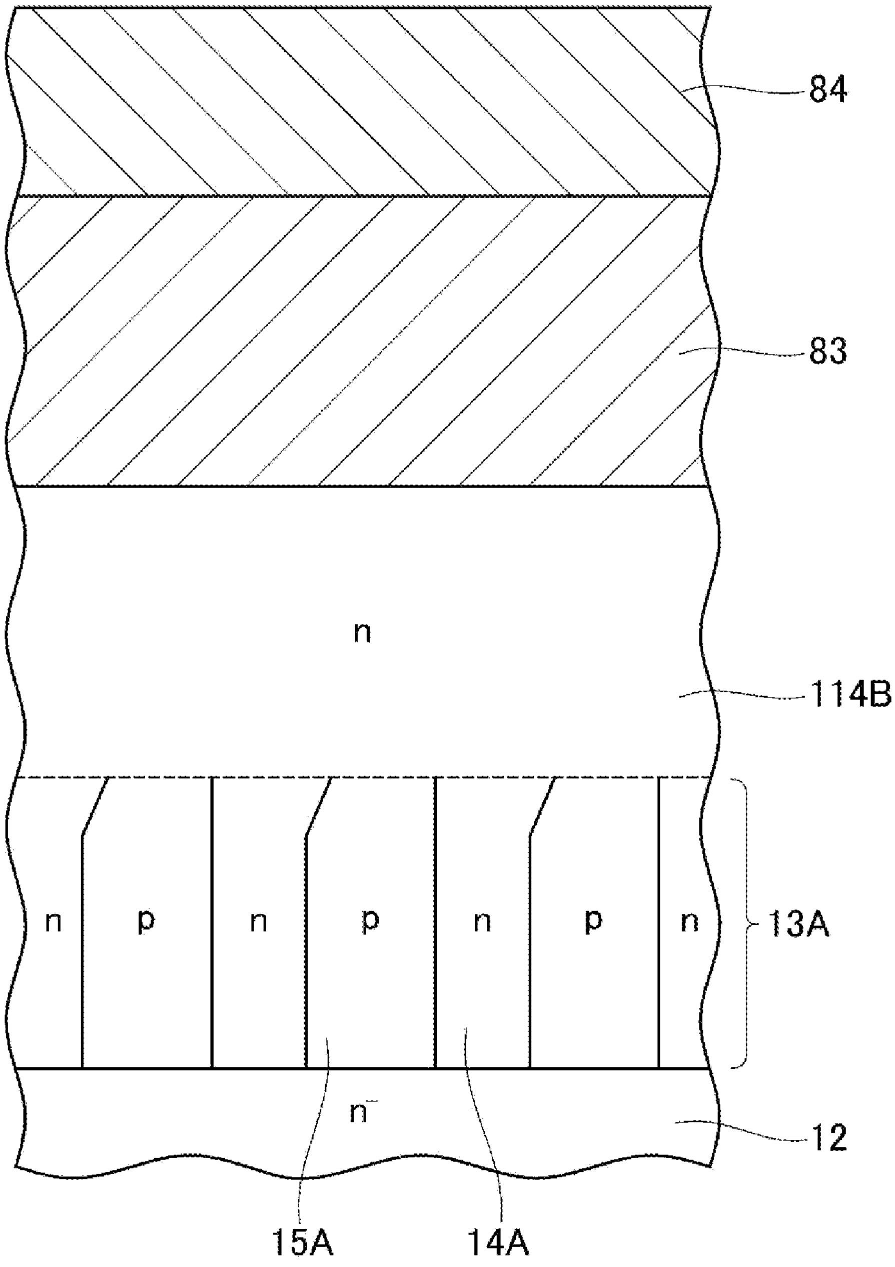
FIG. 47 schematically shows an enlarged sectional view of the repeating layer in the embodiment in a process of the fourth manufacturing method.

Next, as shown in FIG. 47, a mask film 83 and a photoresist film 84 are formed on the n-type upper epitaxial layer 114B.

Figure 48:
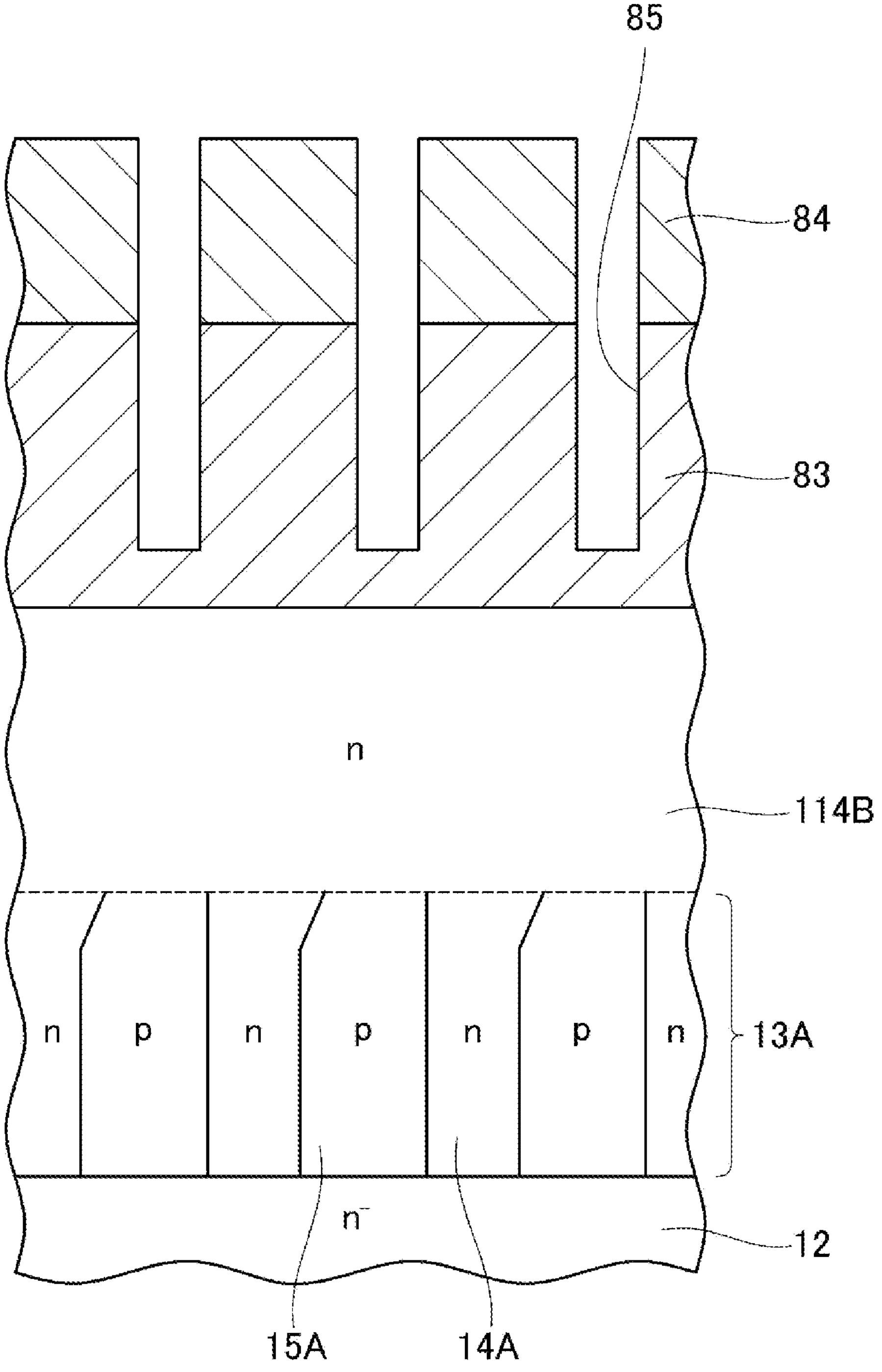
FIG. 48 schematically shows an enlarged sectional view of the repeating layer in the embodiment in a process of the fourth manufacturing method.

Next, as shown in FIG. 48, after the photoresist film 84 is patterned, an opening 85 is formed in the mask film 83 by using a dry etching technique. However, at this stage, the mask film 83 remains on the bottom surface of the opening 85.

Figure 49:
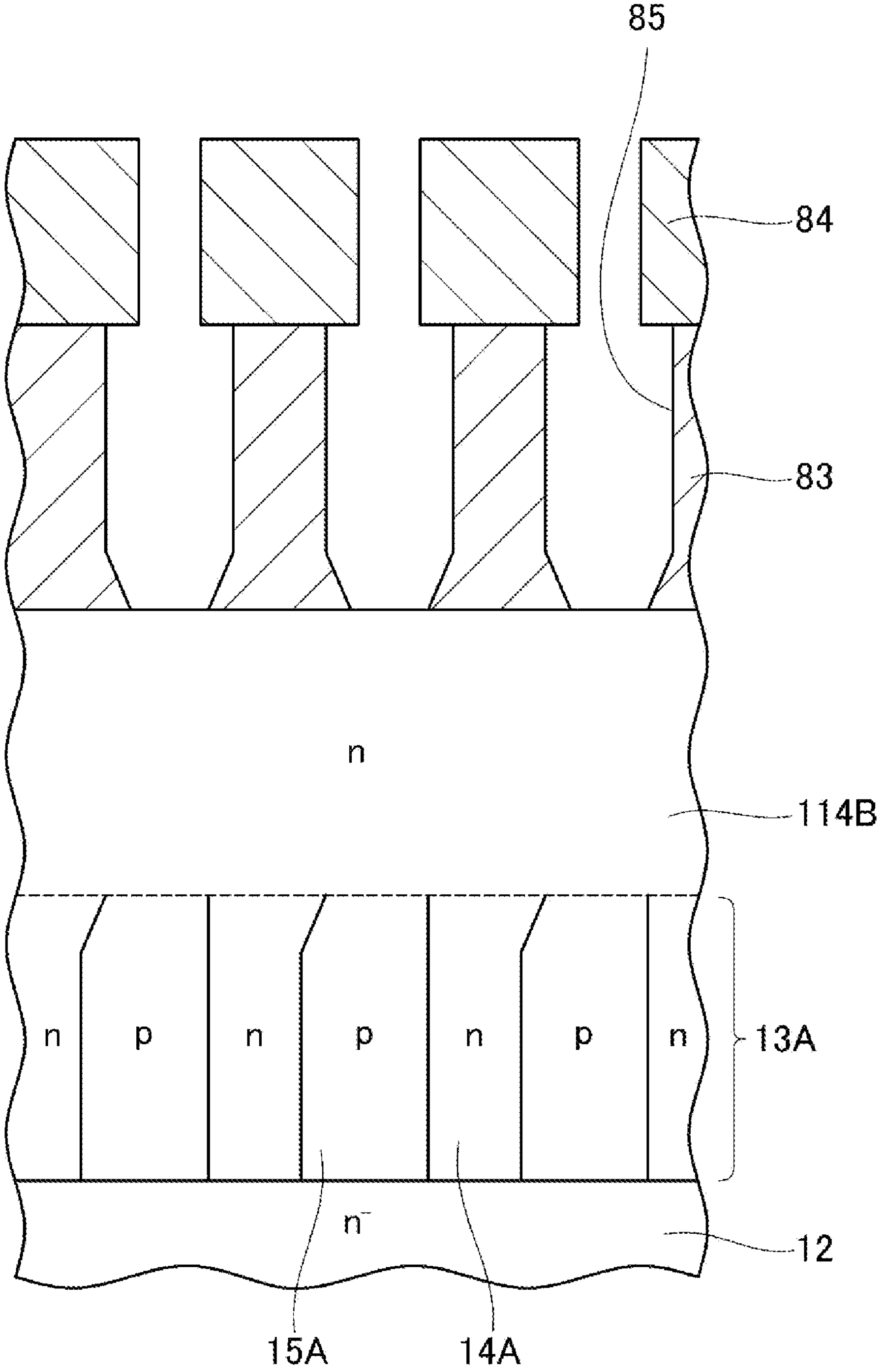
FIG. 49 schematically shows an enlarged sectional view of the repeating layer in the embodiment in a process of the fourth manufacturing method.

Next, as shown in FIG. 49, the opening 85 of the mask film 83 is enlarged using a wet etching technique so that the upper surface of the n-type upper epitaxial layer 114B is exposed from the bottom surface of the opening 85. In this step, the sidewall defining the bottom of the opening 85 of the mask film 83 may be formed to be rounded for isotropic etching.

Figure 50:
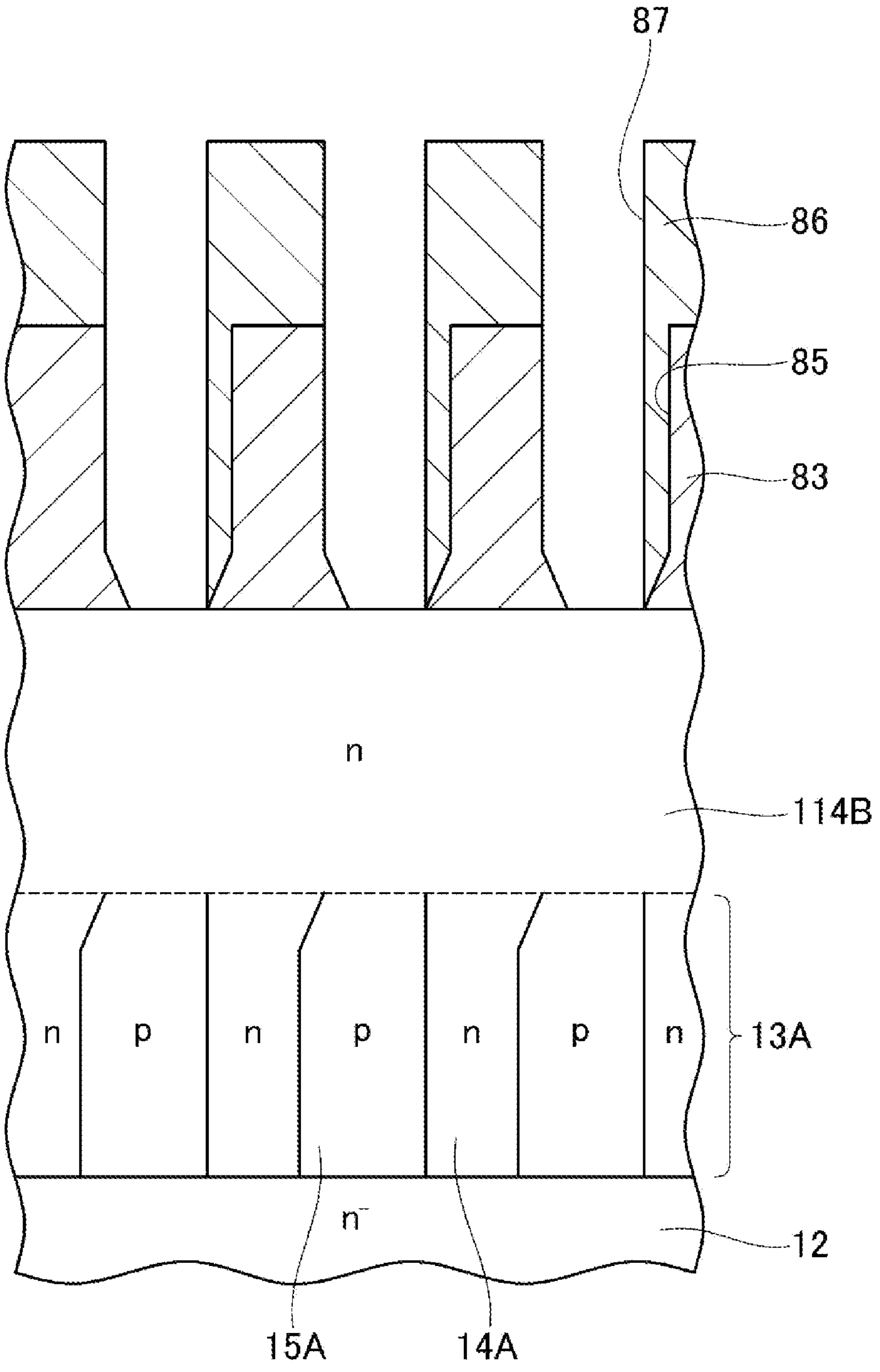
FIG. 50 schematically shows an enlarged sectional view of the repeating layer in the embodiment in a process of the fourth manufacturing method.

Next, as shown in FIG. 50, after the photoresist film 84 is removed, a photoresist film 86 is newly formed on the mask film 83, and an opening 87 is formed in the photoresist film 86 by using a dry etching technique. The photoresist film 86 in which the opening 87 is formed is processed so as to cover one of the side surfaces of the mask film 83 and to expose the other.

Figure 51:
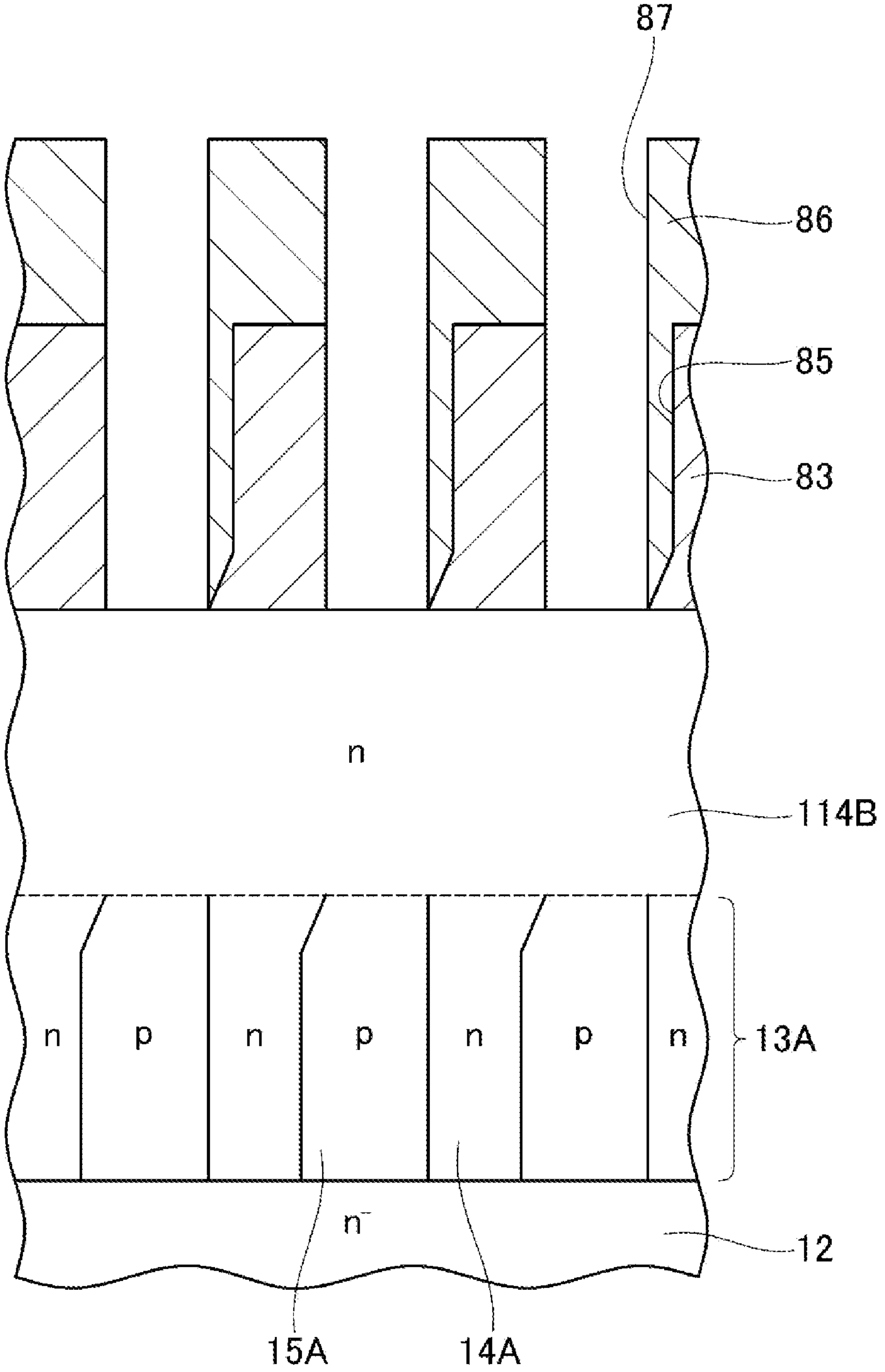
FIG. 51 schematically shows an enlarged sectional view of the repeating layer in the embodiment in a process of the fourth manufacturing method.

Next, as shown in FIG. 51, a part of the bottom portion of the mask film 83 protruding into the opening 87 of the photoresist film 86 is removed using a dry etching technique.

Figure 52:
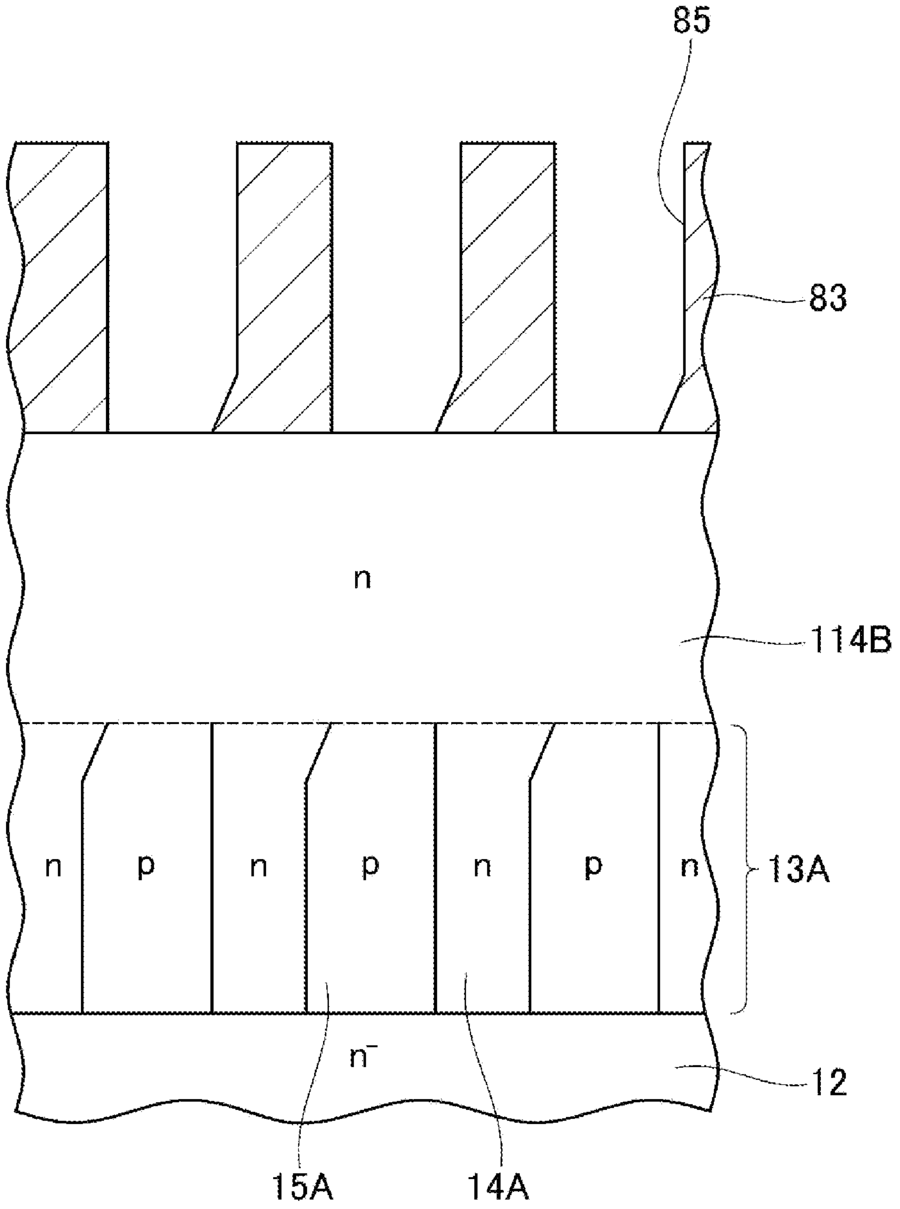
FIG. 52 schematically shows an enlarged sectional view of the repeating layer in the embodiment in a process of the fourth manufacturing method.

Next, as shown in FIG. 52, the photoresist film 86 is removed.

Figure 53:
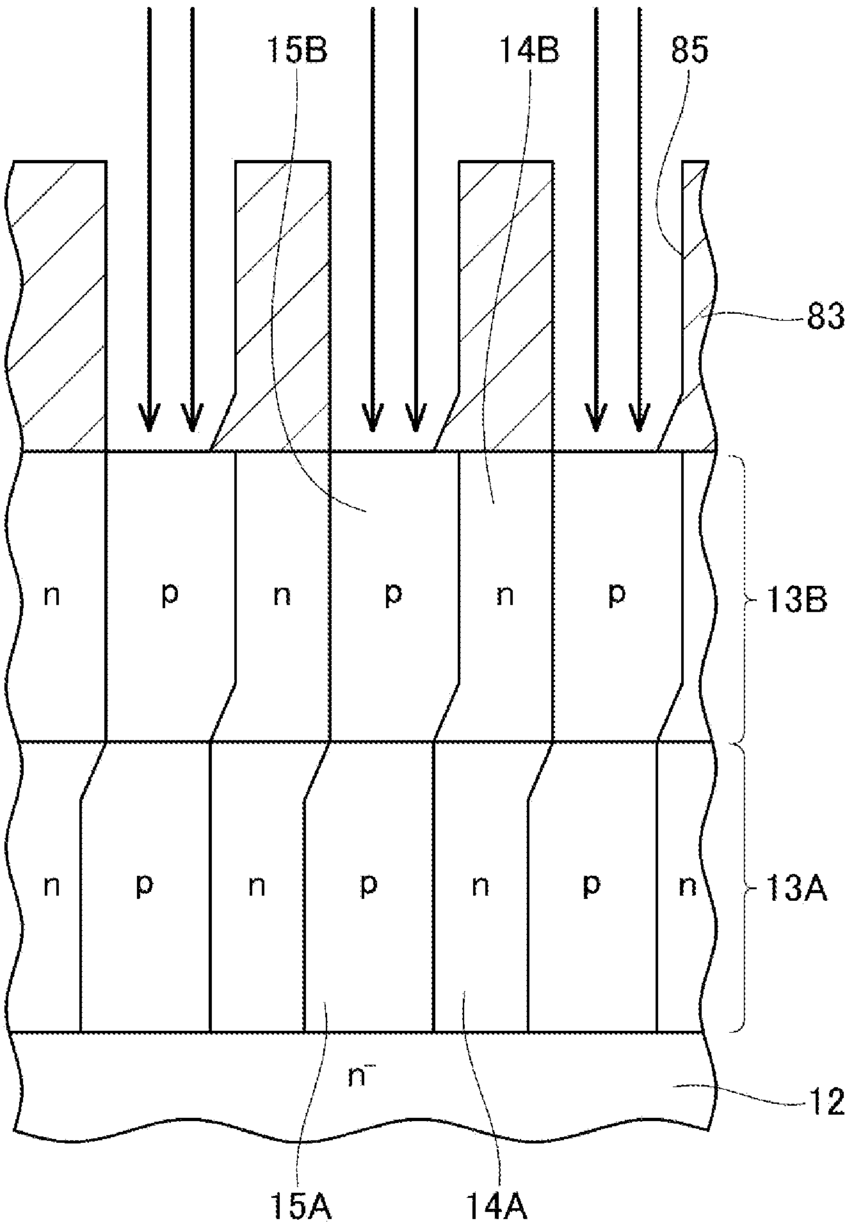
FIG. 53 schematically shows an enlarged sectional view of the repeating layer in the embodiment in a process of the fourth manufacturing method.

Next, as shown in FIG. 53, p-type ions are implanted into the n-type upper epitaxial layer 114B through the opening 85 of the mask film 83 by using an ion implantation technique. The ion implantation angle is set as a direction perpendicular to the upper surface of the n-type upper epitaxial layer 114B. In the n-type upper epitaxial layer 114B, p-type ions are implemented corresponding to the shape of the opening 85 of the mask film 83, and the upper portions 15B are formed. In addition, the upper portions 14B are formed in the remaining portion of the n-type upper epitaxial layer 114B after the upper portions 15B are formed. As a result, the upper layer 13B including the upper portions 15B and the upper portions 14B is formed. Through these steps, the repeating layer 13 in which the lower layer 13A and the upper layer 13B are stacked can be formed.

Although the embodiments have been described in detail above, these are merely examples and do not limit the scope of claims. The techniques described in claims include various modifications of the specific examples illustrated above. The technical elements described in the present specification or the drawings exhibit technical usefulness alone or in various combinations, and are not limited to the combinations described in the claims at the time of filing. In addition, the techniques illustrated in the present specification or drawings achieve a plurality of objectives at the same time, and achieving one of the objectives itself has technical usefulness.

What is claimed is:

1. A semiconductor device comprising: a repeating layer in which a first conductivity column and a second conductivity column are alternately arranged in a repeating direction when a semiconductor substrate is viewed in a plan view, wherein the repeating layer includes:

a lower layer in which a lower portion of the first conductivity column and a lower portion of the second conductivity column are alternately arranged in the repeating direction; and an upper layer in which an upper portion of the first conductivity column and an upper portion of the second conductivity column are alternately arranged in the repeating direction, at least one of the lower portion of the second conductivity column and the upper portion of the second conductivity column includes a central portion and an end portion between the central portion and a boundary surface of the lower layer and the upper layer, and a width of the end portion in the repeating direction, on the boundary surface, is smaller than a width of the central portion in the repeating direction, each of the first conductivity column and the second conductivity column extends in a direction perpendicular to the repeating direction, when the semiconductor substrate is viewed in a plan view, and the width of the end portion in the repeating direction, on the boundary surface, periodically changes along the direction perpendicular to the repeating direction when the semiconductor substrate is viewed in the plan view.

2. The semiconductor device according to claim 1, wherein a width of the first conductivity column in the repeating direction, adjacent to the central portion of the second conductivity column, is less than 1.0 μm.

3. The semiconductor device according to claim 1, wherein each of the lower portion of the second conductivity column and the upper portion of the second conductivity column has the central portion and the end portion.

4. The semiconductor device according to claim 1, wherein side surfaces of the end portion facing in the repeating direction are located inward of side surfaces of the central portion facing in the repeating direction.

5. The semiconductor device according to claim 1, wherein the repeating layer is a super junction layer.

6. The semiconductor device according to claim 1, further comprising a drift region having impurities of a first conductivity type; and a body region having impurities of a second conductivity type, wherein each first conductivity column has a first conductivity column lower end in contact with the drift region and a first conductivity column upper end in contact with the body region, and each second conductivity column has a second conductivity column lower end in contact with the drift region and a second conductivity column upper end in contact with the body region.

7. The semiconductor device according to claim 6, wherein a first conductivity type impurity concentration of the first conductivity column is higher than a first conductivity type impurity concentration of the drift region, and a second conductivity type impurity concentration of the second conductivity column is higher than a second conductivity type impurity concentration of the body region.

* * * * *